US006943056B2

(12) United States Patent
Nemoto

(10) Patent No.: US 6,943,056 B2
(45) Date of Patent: Sep. 13, 2005

(54) SEMICONDUCTOR DEVICE MANUFACTURING METHOD AND ELECTRONIC EQUIPMENT USING SAME

(75) Inventor: Yoshihiko Nemoto, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/405,462

(22) Filed: Apr. 3, 2003

(65) Prior Publication Data

US 2003/0194860 A1 Oct. 16, 2003

(30) Foreign Application Priority Data

Apr. 16, 2002 (JP) ........................ 2002-113368

(51) Int. Cl.⁷ .................. H01L 21/44; H01L 21/48; H01L 21/50
(52) U.S. Cl. ................ 438/106; 438/107; 438/108; 438/110; 438/113; 438/114; 438/118; 438/119; 438/455; 438/458; 438/460; 438/464; 438/465; 438/598; 438/599; 438/620; 438/667
(58) Field of Search ................ 438/106–108, 438/110, 113–114, 118–119, 455, 458, 460, 464–465, 598–599, 620, 667

(56) References Cited

U.S. PATENT DOCUMENTS

| 5,447,871 | A | * | 9/1995 | Goldstein | 438/618 |
|---|---|---|---|---|---|
| 5,618,752 | A | * | 4/1997 | Gaul | 438/626 |
| 5,646,067 | A | * | 7/1997 | Gaul | 438/458 |
| 5,841,194 | A | * | 11/1998 | Tsukamoto | 257/729 |
| 5,892,288 | A | * | 4/1999 | Muraki et al. | 257/778 |
| 6,027,956 | A | * | 2/2000 | Irissou | 438/68 |
| 6,355,501 | B1 | * | 3/2002 | Fung et al. | 438/107 |
| 6,458,619 | B1 | * | 10/2002 | Irissou | 438/66 |
| 6,503,779 | B2 | * | 1/2003 | Miyazaki | 438/108 |
| 6,583,030 | B1 | * | 6/2003 | Grassl | 438/459 |
| 6,620,731 | B1 | * | 9/2003 | Farnworth et al. | 438/667 |
| 6,734,084 | B1 | * | 5/2004 | Nemoto et al. | 438/466 |
| 2002/0151171 | A1 | * | 10/2002 | Furusawa | 438/660 |
| 2002/0192939 | A1 | * | 12/2002 | Sugihara | 438/629 |
| 2003/0200654 | A1 | * | 10/2003 | Omote et al. | 29/852 |
| 2003/0222354 | A1 | * | 12/2003 | Mastromatteo et al. | 257/774 |
| 2004/0009624 | A1 | * | 1/2004 | Gormley et al. | 438/50 |
| 2004/0259351 | A1 | * | 12/2004 | Koizumi et al. | 438/667 |
| 2005/0003649 | A1 | * | 1/2005 | Takao | 438/612 |
| 2005/0029630 | A1 | * | 2/2005 | Matsuo | 257/628 |

* cited by examiner

Primary Examiner—Lynne A. Gurley
(74) Attorney, Agent, or Firm—McDermott Will & Emery LLP

(57) ABSTRACT

A method of manufacturing semiconductor devices includes the following steps. That is, a support board is adhered to a rear surface of a substrate proper which has a plurality of circuit element parts with prescribed functions formed on a circuit forming plane on an obverse surface thereof. First groove portions are formed in the substrate proper. An insulating film (17) is formed on a surface of a semiconductor substrate (50) by using an insulating material, and holes are formed in the first groove portions. Metal wiring patterns (8) are formed which extend from electrode portions to at least parts of inner walls of the holes. A prescribed amount of the support board at a bottom of each of the holes is removed. A conductive material is filled into the holes thereby to form penetration electrodes (10). A second groove portions are formed in the first groove portions.

17 Claims, 34 Drawing Sheets

SEMICONDUCTOR DEVICE MANUFACTURING METHOD AND ELECTRONIC EQUIPMENT USING SAME

BACKGROUND OF THE INVENTION

1. Field of the Invention

The present invention relates to a method for manufacturing semiconductor devices which have penetration electrodes extending from a circuit forming plane on a surface of a substrate proper or main body to a rear surface thereof, and it also relates to electronic equipment incorporating therein semiconductor devices manufactured by such a method.

2. Description of the Related Art

FIG. 63A through FIG. 63G are cross sectional views showing respective process steps for manufacturing known semiconductor devices having penetration electrodes.

Hereinafter, reference will be made to the manufacturing procedure of the semiconductor devices while referring to these figures.

First of all, a substrate main body or proper 201 is produced which has a plurality of circuit element parts 202 with prescribed functions arranged on a circuit forming plane on one or obverse surface thereof, as shown in FIG. 63A.

Then, a plurality of holes 203 with a depth of 100 $\mu$m or less from the obverse surface of the substrate proper 201 comprising a silicon wafer are formed, as shown in FIG. 63B.

Thereafter, an insulating film is formed on the inner wall surface of each of the holes 203, and a metal film, which later becomes a cathode for electroplating, is then deposited on the insulating film. After that, with the metal film being made as a cathode, the interior of each of the holes 203 is buried or filled with a metal to form a penetration electrode 204, as shown in FIG. 63C.

Subsequently, the rear surface of the substrate proper 201 is removed until an end face of each penetration electrode 204 is exposed, as shown in FIG. 63D, and the rear surface of the substrate proper 201 is then selectively etched, as shown in FIG. 63E.

Thereafter, an insulating film 205 made of $SiO_2$ is deposited on the rear surface of the substrate proper 201 by a chemical vapor deposition method (CVD), as shown in FIG. 63F.

Then, by removing the portions of the insulating film 205 covering the penetration electrodes 204 through etching by the use of a photolithography process, a semiconductor device assembly with the penetration electrodes 204 penetrating through the substrate proper 201 is produced, as shown in FIG. 63G, and it is finally divided into a plurality of pieces to produce semiconductor devices.

In the method for manufacturing semiconductor devices having the penetration electrodes 204 as constructed above, the etching process is performed prior to the formation of the penetration electrodes. In the case of using the etching process in this manner, however, the maximum depth of the holes 203, which can be formed by a trench etching process, is about 100 $\mu$m. Therefore, when the rear surface of the substrate proper 201 is removed until one end face of each penetration electrode 204 is exposed, the thickness of the substrate proper 201 cannot help being made extremely thin, as shown in FIG. 63D.

The post processing after this state includes an etching process step for etching the rear surface of the substrate proper 201, a process step for forming the insulating film 205 after the etching process, an etching removing process step for removing those portions of the insulating film 205 which cover the penetration electrodes 204 by means of photolithography, as shown in FIG. 63E through FIG. 63G. As a result, there arises a problem that the substrate proper 201, which has been made extremely thin, might be damaged by handling in these process steps, thus reducing the product yield of semiconductor devices.

SUMMARY OF THE INVENTION

The present invention is intended to obviate the problem as referred to above, and has for its object to provide a method of manufacturing semiconductor devices in which the semiconductor devices having penetration electrodes can be manufactured with good yield and with ease while reducing damage thereto during handling of semiproducts or intermediate products thereof.

Another object of the present invention is to provide electronic equipment which incorporates therein semiconductor devices obtained by such a semiconductor device manufacturing method.

According to a general aspect, the present invention resides in a method for manufacturing semiconductor devices, which includes the steps of: adhering a support board to a rear surface of a substrate proper which has a plurality of circuit element parts with prescribed functions formed on a circuit forming plane on an obverse surface thereof; forming first groove portions, which reach the support board, on at least one of peripheral portions of the circuit element parts of the substrate proper and prescribed portions in the circuit element parts; forming holes in the first groove portions by using an insulating material in such a manner that the support board is exposed from a bottom of each of the holes; forming metal wiring patterns which extend from electrode portions formed in the circuit element parts to at least parts of inner walls of the holes; removing a prescribed amount of the support board at the bottom of each of the holes: filling a conductive material into the holes to form penetration electrodes in such a manner that the conductive material protrudes from the circuit forming plane; forming second groove portions, which reach the support board, in the peripheral portions of the circuit element parts; and removing the support board thereby to separate the substrate proper and the circuit element parts into a plurality of semiconductor devices.

According to a specific aspect, the present invention resides in electronic equipment including a plurality of semiconductor devices which are manufactured according to the above-mentioned semiconductor device manufacturing method, wherein the plurality of semiconductor devices are laminated in such a manner that vertically adjacent projection electrodes are mutually connected with each other.

According to another specific aspect, the present invention resides in electronic equipment including at least one semiconductor device manufactured according to the above-mentioned semiconductor device manufacturing method, wherein a circuit board having a passive element mounted thereon is connected with penetration electrodes formed on one surface of the at least one semiconductor device.

According to a further specific aspect, the present invention resides in electronic equipment including at least one semiconductor device manufactured according to the above-mentioned semiconductor device manufacturing method, wherein the at least one semiconductor device is embedded in a core of a circuit board, and wirings formed on opposite side surfaces of the circuit board are connected with penetration electrodes.

The above and other objects, features and advantages of the present invention will become more readily apparent to those skilled in the art from the following detailed description of preferred embodiments of the present invention taken in conjunction with the accompanying drawings.

DESCRIPTION OF THE PREFERRED EMBODIMENTS

Now, preferred embodiments of the present invention will be described below in detail while referring to the accompanying drawings.

Embodiment 1.

FIG. 1 through FIG. 10 show respective manufacturing steps in a method for manufacturing semiconductor devices according to a first embodiment of the present invention.

Hereinafter, a manufacturing procedure for semiconductor devices 100 will be explained based on these figures.

First of all, a plurality of circuit element parts 2 having prescribed functions, respectively, are arranged on a circuit forming plane on a surface (obverse surface) of a substrate main body or proper 1 (first step).

Figure 1:
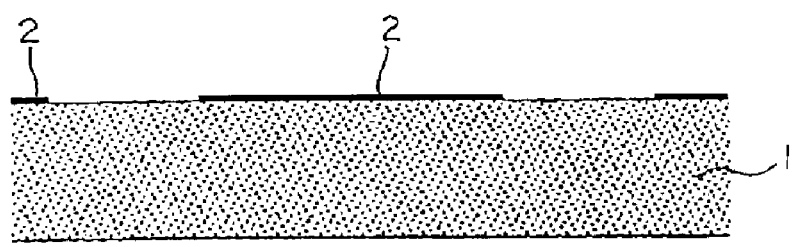
FIG. 1 is a cross sectional view showing one process step in the course of manufacturing semiconductor devices by the use of a semiconductor device manufacturing method according to a first embodiment of the present invention.
Figure 2:
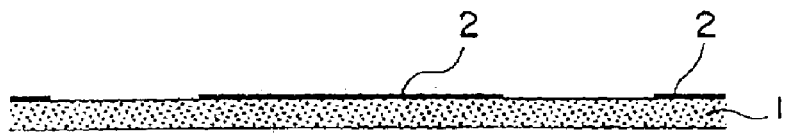
FIG. 2 is a cross sectional view showing another process step in the course of manufacturing semiconductor devices by the use of the semiconductor device manufacturing method according to the first embodiment of the present invention.

Then, a rear surface of the substrate proper 1 on the opposite side of the circuit forming plane is removed up to a prescribed thickness, as shown in FIG. 2 (second step).

Figure 3:
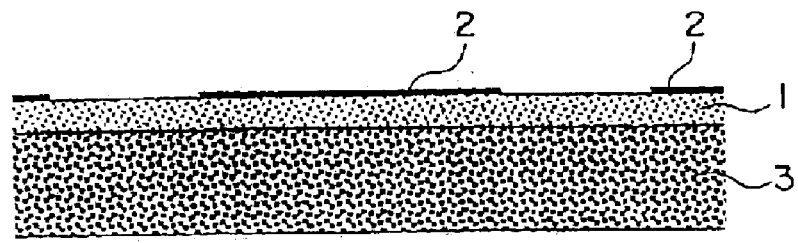
FIG. 3 is a cross sectional view showing a further process step in the course of manufacturing semiconductor devices by the use of the semiconductor device manufacturing method of the first embodiment of the present invention.

Thereafter, a first support board 3 in the form of a metal plate made of aluminum for instance is adhered or bonded to the rear surface of the substrate proper 1, as shown in FIG. 3 (third step). The adhesion or bonding of the support board 3 to the substrate proper 1 is performed by means of anode bonding in which an electric field is applied between the substrate proper 1 and the support board 3 with the substrate proper 1 being made as an anode and the support board 3 as a cathode. Here, note that an oxide film in the form of a silicon oxide film is formed on the rear surface of the substrate proper 1 before the support board 3 is bonded to the rear surface of the substrate proper 1, so that the rear surface of each semiconductor substrate to be described later is stabilized electrically and chemically thereby to improve the electrical performance and reliability of the semiconductor devices manufactured.

Figure 4A:
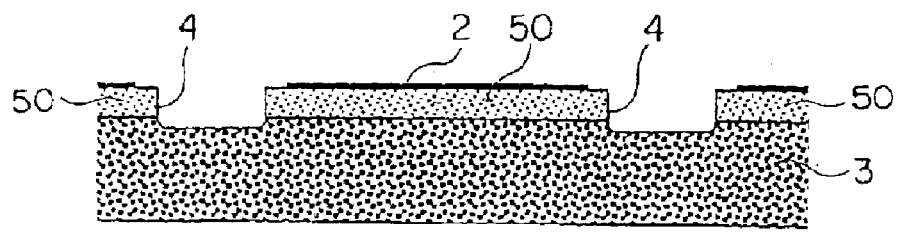
FIG. 4A is a cross sectional view along line A—A of FIG. 4B.
Figure 4B:
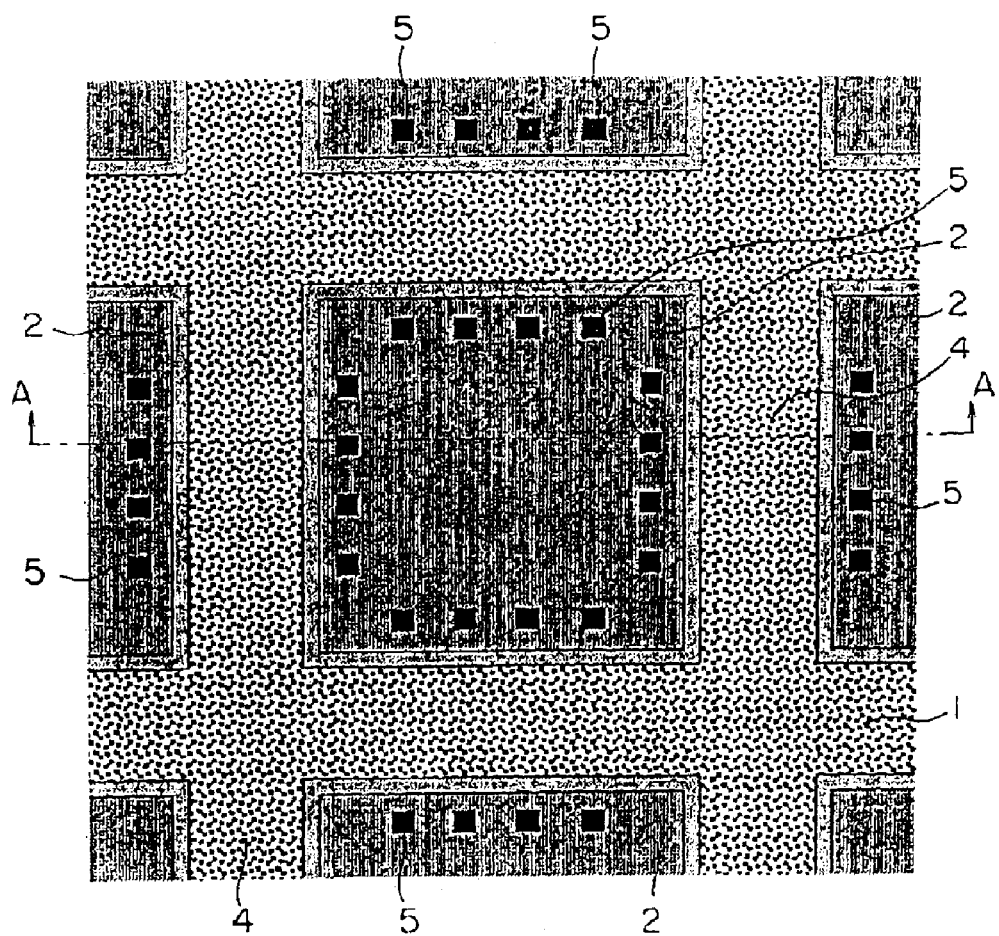
FIG. 4B is a plan view showing a still further process step in the course of manufacturing semiconductor devices by the use of the semiconductor device manufacturing method according to the first embodiment of the present invention.

Next, a plurality of first groove portions 4 of a grid-like configuration, which extend through the substrate proper 1 to the first support board 3, are formed in areas of the substrate proper 1 other than the areas of the circuit element parts 2 by using dicing for instance, as shown in FIG. 4A and FIG. 4B (fourth step). As a result, the substrate proper 1 is divided into a plurality of semiconductor substrates 50.

Figure 5A:
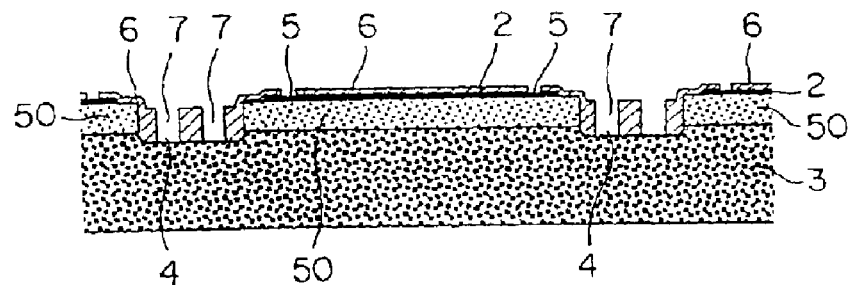
FIG. 5A is a cross sectional view along line B—B of FIG. 5B.
Figure 5B:
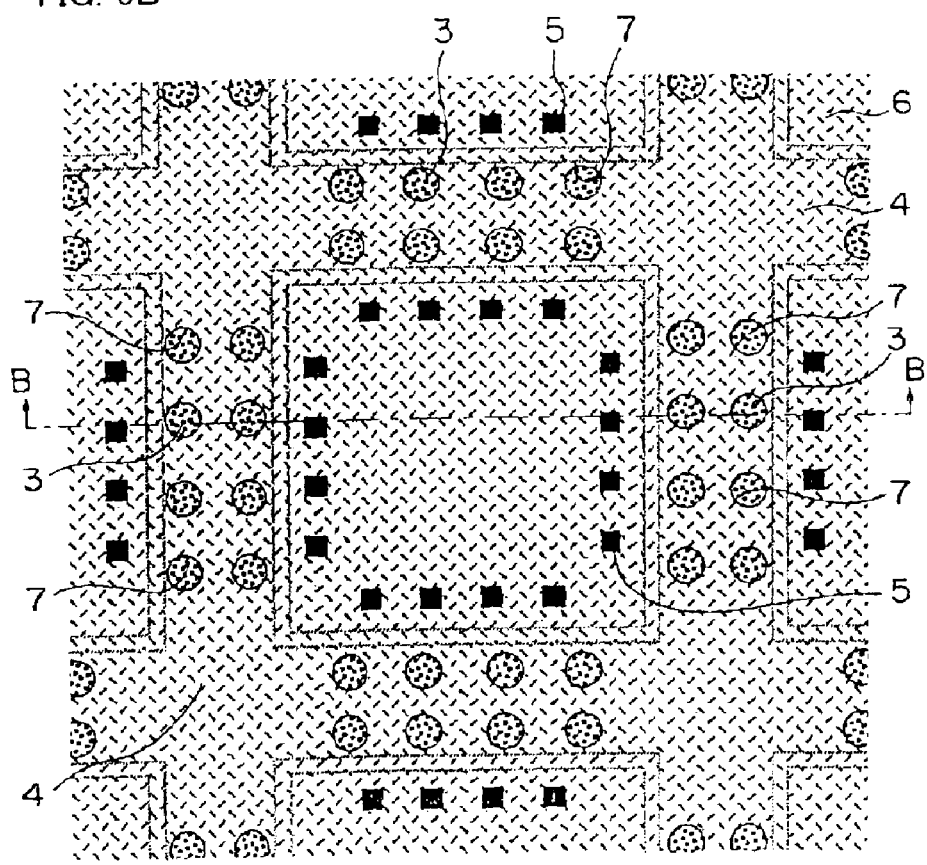
FIG. 5B is a plan view showing a yet further process step in the course of manufacturing semiconductor devices by the use of the semiconductor device manufacturing method according to the first embodiment of the present invention.

Thereafter, an insulating film 6 is formed on the surfaces of the semiconductor substrates 50 by using, for instance, a photosensitive polyimide resin as an insulating material in such a manner that electrode portions 5 are exposed from the insulating film 6 at appropriate locations in the circuit element parts 2, as shown in FIG. 5A and FIG. 5B. In addition, a plurality of holes 7 that reach the support board 3 are formed through the insulating film 6 in the first groove portions 4 by means of a photolithography process. Here, note that a photosensitive glass may be used instead of the photosensitive polyimide resin (fifth step).

Figure 6A:
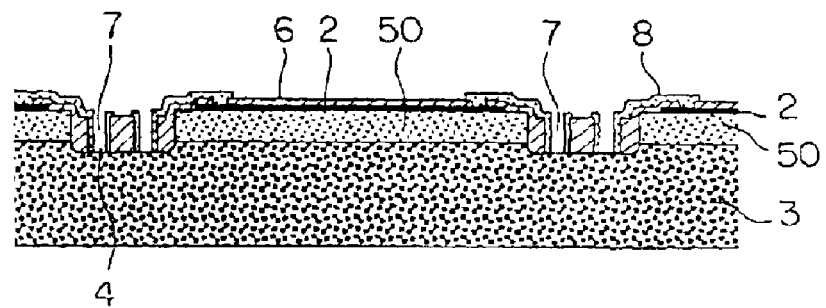
FIG. 6A is a cross sectional view along line C—C of FIG. 6B.
Figure 6B:
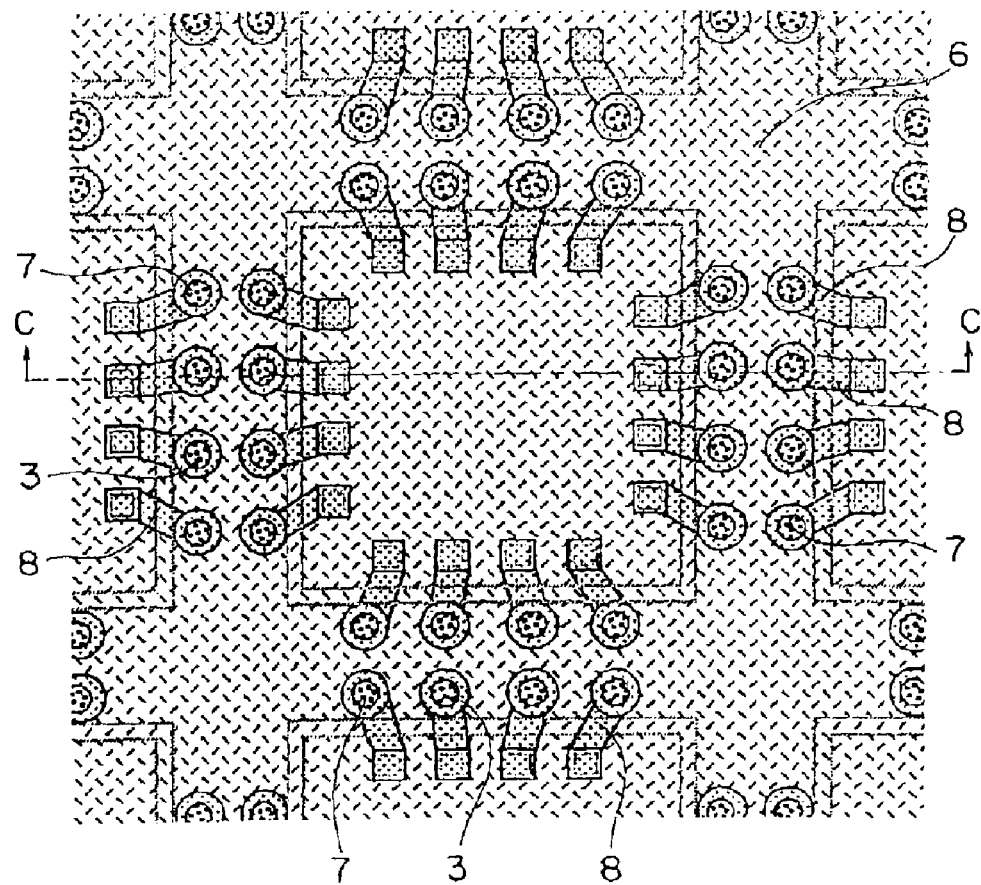
FIG. 6B is a plan view showing a further process step in the course of manufacturing semiconductor devices by the use of the semiconductor device manufacturing method according to the first embodiment of the present invention.

Then, metal wiring patterns 8 are formed in such a manner that they extend from the electrode portions 5 to at least parts of the inner walls of the corresponding holes 7, as shown in FIG. 6A and FIG. 6B (sixth step).

Figure 7:
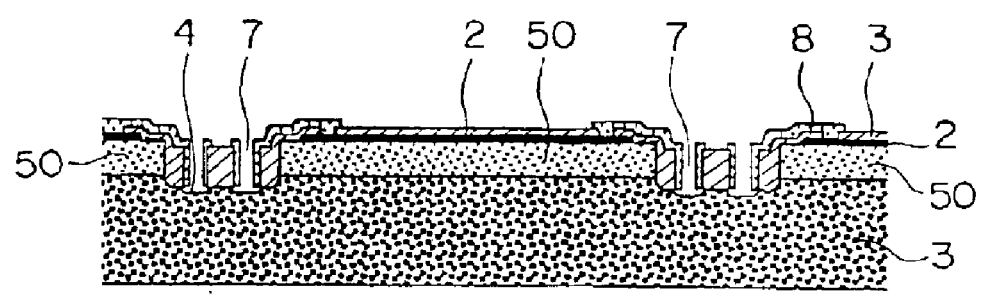
FIG. 7 is a cross sectional view showing a further process step in the course of manufacturing semiconductor devices by the use of the semiconductor device manufacturing method according to the first embodiment of the present invention.

Subsequently, a prescribed amount of the support board 3 exposed at the bottom of each hole 7 is removed by a wet etching process for instance, as shown in FIG. 7 (seventh process).

Figure 8A:
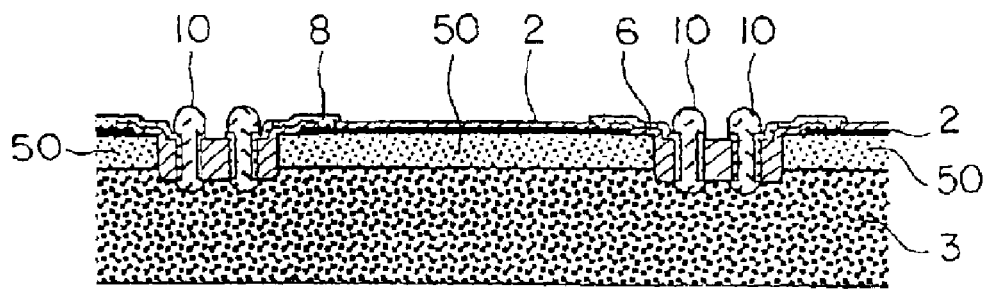
FIG. 8A is a cross sectional view along line D—D of FIG. 8B.
Figure 8B:
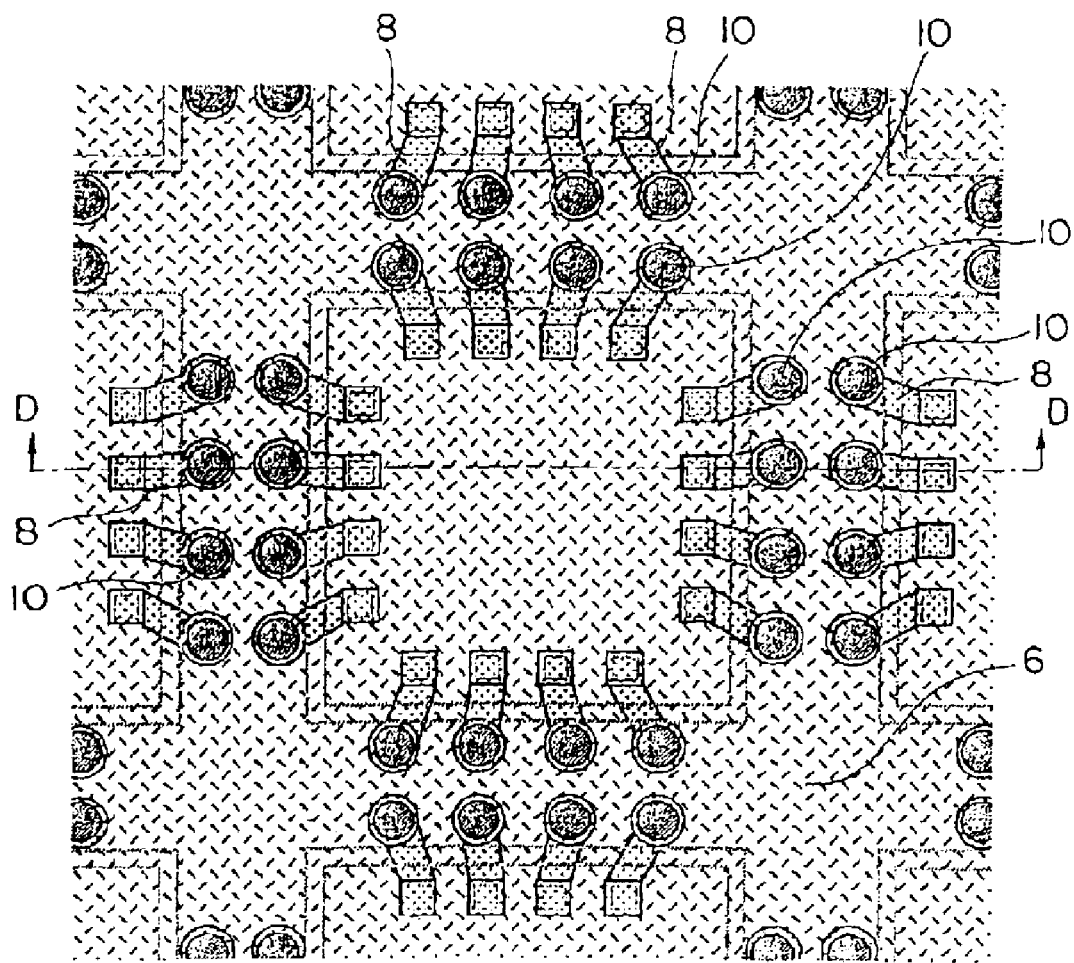
FIG. 8B is a plan view showing a further process step in the course of manufacturing semiconductor devices by the use of the semiconductor device manufacturing method according to the first embodiment of the present invention.

Thereafter, a conductive metal such as a solder for instance is buried or filled into the holes 7 so as to protrude from the surfaces of the metal wiring patterns 8 by means of electroplating, for example, with the first support board 3 being made as a cathode, thus forming penetration electrodes 10, as shown in FIGS. 8A and 8B (eighth step).

Figure 9A:
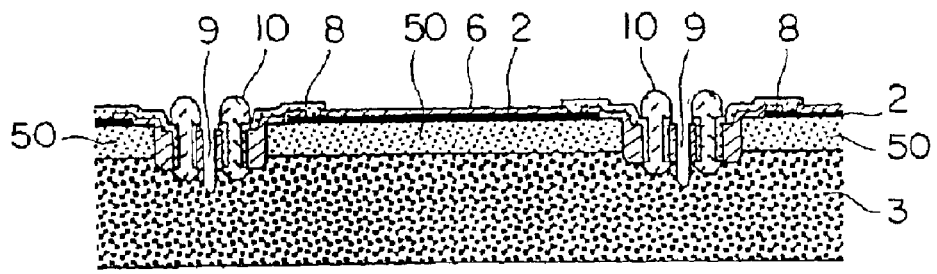
FIG. 9A is a cross sectional view along line E—E of FIG. 9B.
Figure 9B:
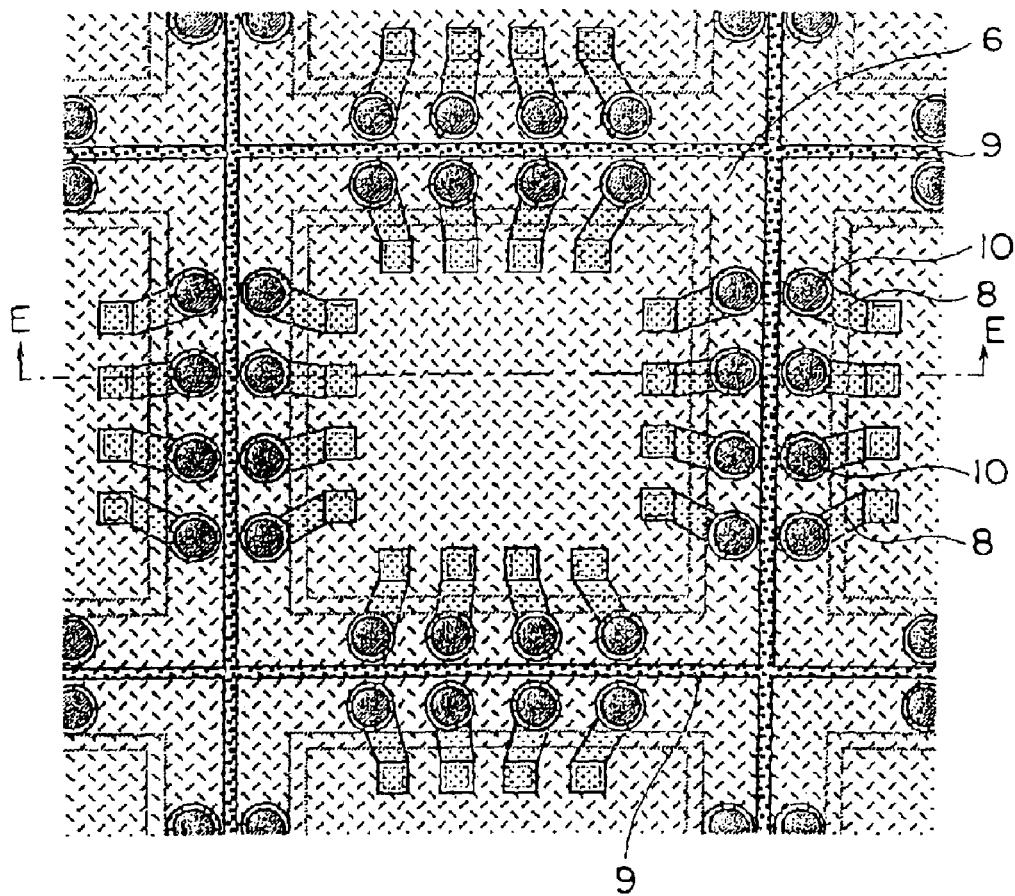
FIG. 9B is a plan view showing a further process step in the course of manufacturing semiconductor devices by the use of the semiconductor device manufacturing method according to the first embodiment of the present invention.

Then, second groove portions 9 of a grid-like configuration, which reach the first support board 3, are formed along central lines of the first groove portions 4 by using a dicing saw for instance, as shown in FIG. 9A and FIG. 9B (ninth step).

Figure 10A:
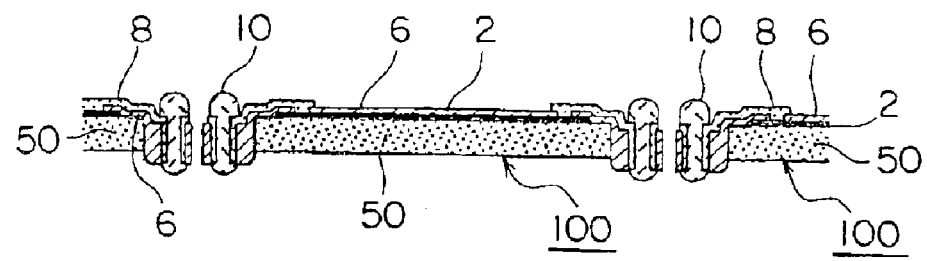
FIG. 10A is a cross sectional view along line F—F of FIG. 10B.
Figure 10B:
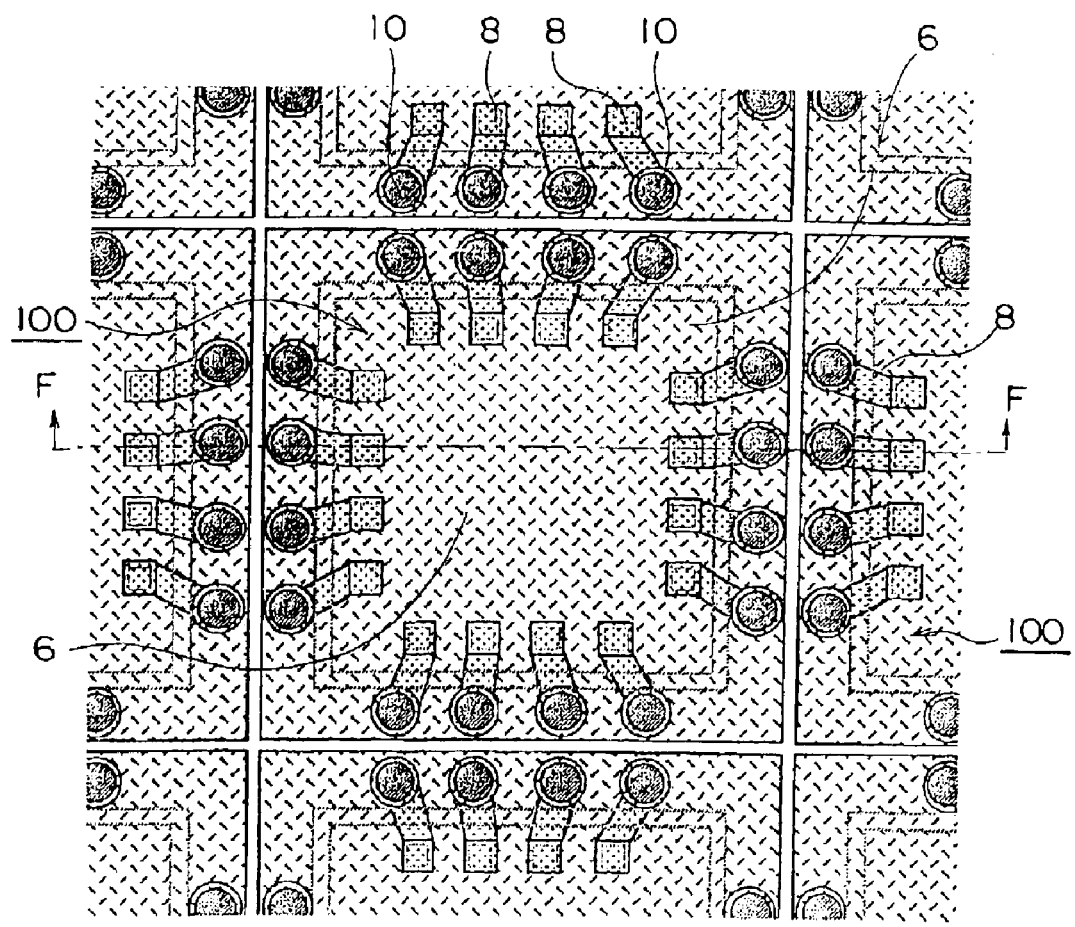
FIG. 10B is a plan view showing a further process step in the course of manufacturing semiconductor devices by the use of the semiconductor device manufacturing method according to the first embodiment of the present invention.

Finally, the first support board 3 is removed by wet etching to produce a plurality of semiconductor devices 100 which have penetration electrodes 10 formed in their peripheral portions and extending from the obverse surface to the rear surface thereof, as shown in FIG. 10A and FIG. 10B (tenth step).

Each of the semiconductor devices 100 thus produced has through holes 7 which are formed through the corresponding semiconductor substrate 50 having the circuit element parts 2 formed on one principle plane thereof, so as to extend from the circuit forming plane to the opposed side surface thereof. Also, each semiconductor device 100 has metal wiring patterns 8 and penetration electrodes 10, which together form electrical conduction paths along the through holes 7. An insulating material in the form of a photosensitive polyimide resin is arranged to surround the peripheries of these electrical conduction paths 8, 10 with nothing other than the insulating material being interposed between adjacent ones of these conduction paths 8, 10.

With the above-mentioned method for manufacturing semiconductor devices according this embodiment, it is possible to easily manufacture semiconductor devices 100 each having the penetration electrodes 10 in the peripheral portions thereof.

In addition, a prescribed amount of the substrate proper 1 on the rear surface thereof is removed before the support board 3 is adhered or bonded to the substrate proper 1, and hence it becomes possible to form the holes 7 in the semiconductor substrates 50 with ease.

Moreover, the oxide film in the form of the silicon oxide film is formed on the rear surface of the substrate proper 1, so that the rear surfaces of the semiconductor substrates 50 are stabilized electrically and chemically. As a result, the electrical performance and reliability of the semiconductor devices 100 can be improved.

Further, since the support board 3 is adhered to the rear surface of the substrate proper 1 through anode bonding, there is interposed no dissimilar material such as an adhesive or the like between the support board 3 and the rear surface of the substrate proper 1, thus reducing in-process constraints such as chemical resistance, etc.

Furthermore, the first groove portions 4, which are formed by using the dicing saw, can be made easily and efficiently.

Still further, the holes 7 are formed in two rows in and along each of the first groove portions 4 between adjacent ones of the circuit element parts 2. Thus, the penetration electrodes 10 at each peripheral portion or side of each semiconductor device of a rectangular or square configuration are formed in each of the common first groove portions 4. As a result, the manufacturing steps become simple, and the production of the semiconductor devices is easy.

It is to be noted that the first groove portions 4 can also be formed by reactive ion etching, and in this case, it is possible to provide the first groove portions 4 with higher dimensional precision.

In addition, the insulating film 6 is formed on the obverse surface of the semiconductor substrate 50 by using the photosensitive polyimide resin that is an insulating material, at the same time when the holes 7 reaching the support board 3 at the first groove portions 4 are formed. As a result, it is not necessary to specially or separately provide a process of forming protective coats on the circuit element parts 2, and the entire processes can be simplified as compared with the use of an insulating material having non-photosensitivity.

Further, since the second groove portions 9 are also made by using the dicing saw, they can be formed easily and efficiently as in the case of the first groove portions 4.

Furthermore, in this embodiment, the support board 3 comprises a metal plate, and the removal of a prescribed amount of the support board 3 at the bottom of each hole 7 is performed by means of an etching process using a corrosion liquid. Therefore, it is possible to easily form the penetration electrodes that protrude from the rear surface of each semiconductor device 100. Additionally, the metal plate is preferably in the form of an aluminum plate, which is light in weight and can be obtained at low cost.

Still further, since the removal of the support board 3 is carried out by the etching process using the corrosion liquid, it is possible to remove the support board 3 quite easily.

Besides, the burial or filling of the metal into the holes 7 is carried out by using electroplating with the support board 3 being made as a cathode, as a consequence of which the selective growth rate of the metal by electroplating is higher than in the case of using electroless plating, thus making it possible to fill the holes 7 alone as well as widening choices of the materials that can be used as such a metal.

Embodiment 2.

Figure 11:
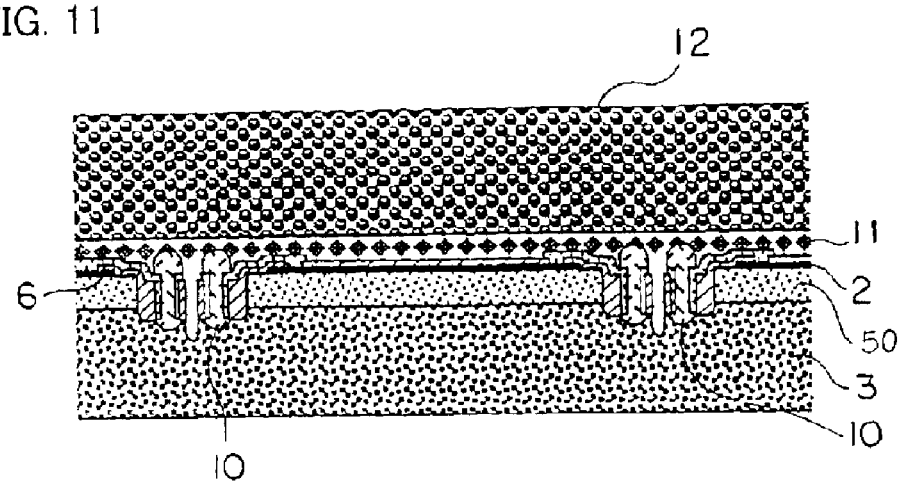
FIG. 11 is a cross sectional view showing one process step in the course of manufacturing semiconductor devices by the use of a semiconductor device manufacturing method according to a second embodiment of the present invention.
Figure 12:
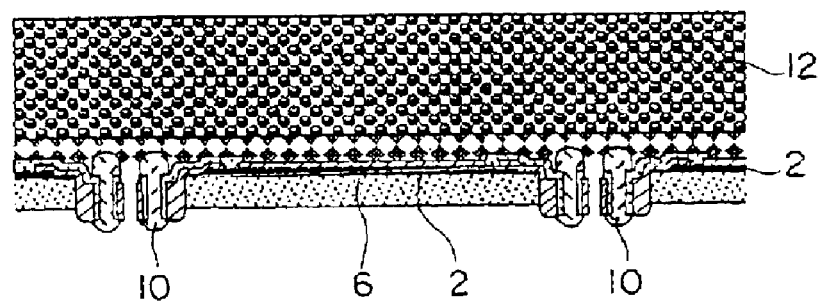
FIG. 12 is a cross sectional view showing another process step in the course of manufacturing semiconductor devices by the use of the semiconductor device manufacturing method according to the second embodiment of the present invention.
Figure 13:
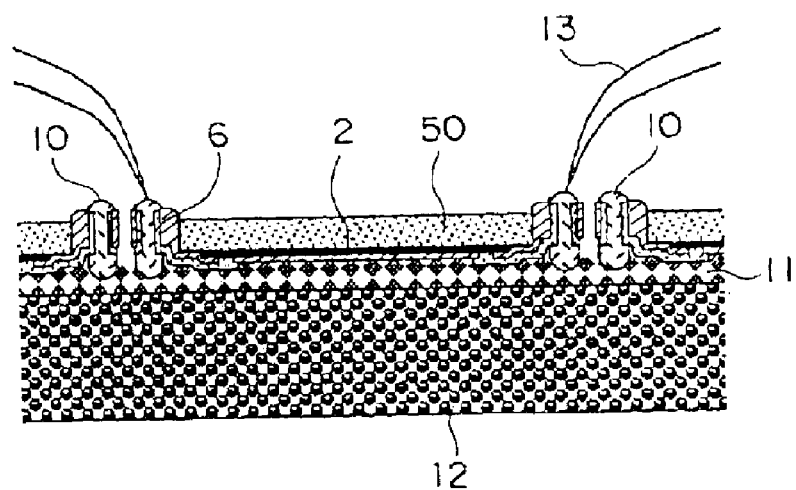
FIG. 13 is a cross sectional view showing a further process step in the course of manufacturing semiconductor devices by the use of the semiconductor device manufacturing method according to the second embodiment of the present invention.

FIG. 11 through FIG. 13 show the respective steps of a method for manufacturing semiconductor devices according to a second embodiment of the present invention.

Note that the same or like members or parts of this and the following embodiments as those of the above-mentioned first embodiment shown in FIG. 1 through FIG. 10 will be identified and described by the same symbols.

The first through ninth steps of this embodiment are identical to those of the above-mentioned first embodiment.

In this embodiment, after the ninth step shown in FIG. 9A and FIG. 9B, a second support board 12, which is made of an insulator at least at its bonding surface side, is adhered to the circuit forming plane side of the semiconductor substrates 50 by the use of an adhesive or binding material 11, as shown in FIG. 11. Here, note that a support film may be used instead of the second support board 12.

Thereafter, the support board 3 is removed by means of wet etching, as shown in FIG. 12.

Then, the semiproducts or intermediate products of the semiconductor devices 100 are inverted as shown in FIG. 13, and needles 13 of test probes are placed in contact with the penetration electrodes 10 so as to test or inspect the circuit functions of the circuit element parts 2.

Finally, the semiconductor devices 100 shown in FIG. 10 are obtained by removing the second support board 12 by means of peeling or other method.

Thus, with the method for manufacturing semiconductor devices according to this second embodiment of the present invention, after the removal of the first support board 3, the plurality of semiconductor devices 100 are integrally held together by means of the second support board 12, so that they are not individualized or separated from one another. Therefore, handling of the semi-manufactured semiconductor devices becomes accordingly easy, and the testing of the functionality of the circuit element parts 2 can be facilitated.

Embodiment 3.

FIG. 14 through FIG. 21 show the respective process steps of a method for manufacturing semiconductor devices according to a third embodiment of the present invention.

Figure 14:
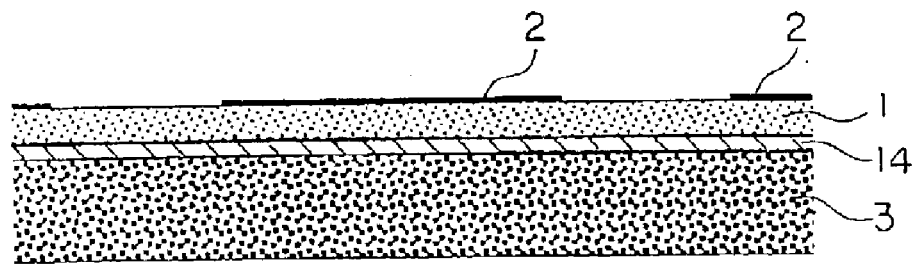
FIG. 14 is a cross sectional view showing one process step in the course of manufacturing semiconductor devices by the use of a semiconductor device manufacturing method according to a third embodiment of the present invention.
Figure 15:
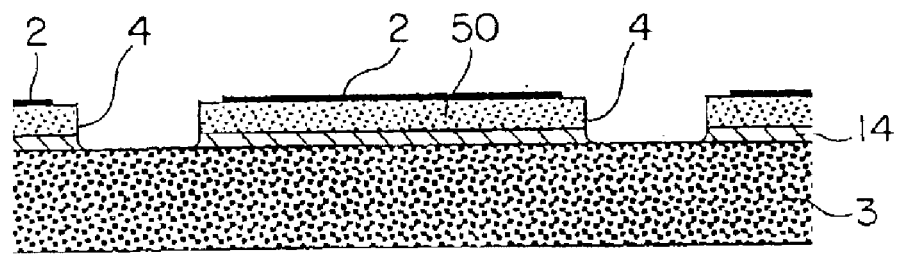
FIG. 15 is a cross sectional view showing another process step in the course of manufacturing semiconductor devices by the use of the semiconductor device manufacturing method according to the third embodiment of the present invention.
Figure 16:
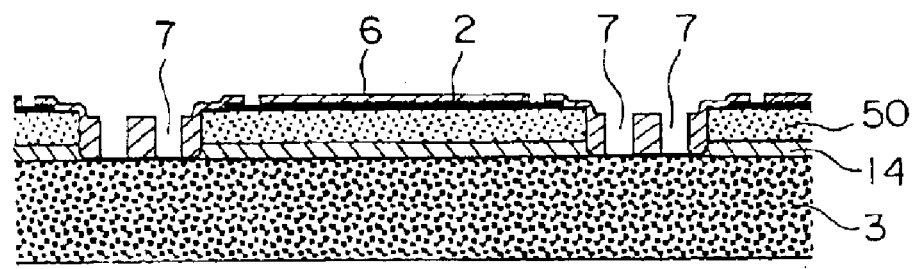
FIG. 16 is a cross sectional view showing a further process step in the course of manufacturing semiconductor devices by the use of the semiconductor device manufacturing method according to the third embodiment of the present invention.
Figure 17:
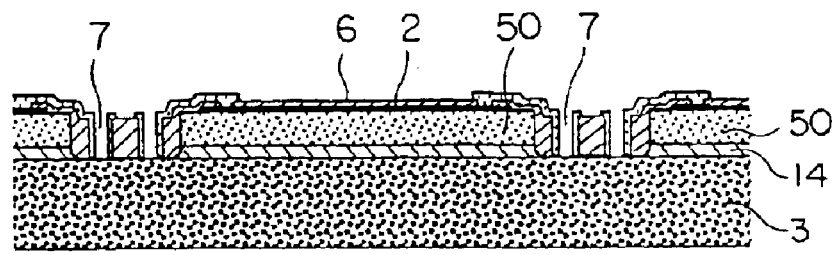
FIG. 17 is a cross sectional view showing a still further process step in the course of manufacturing semiconductor devices by the use of the semiconductor device manufacturing method according to the third embodiment of the present invention.
Figure 18:
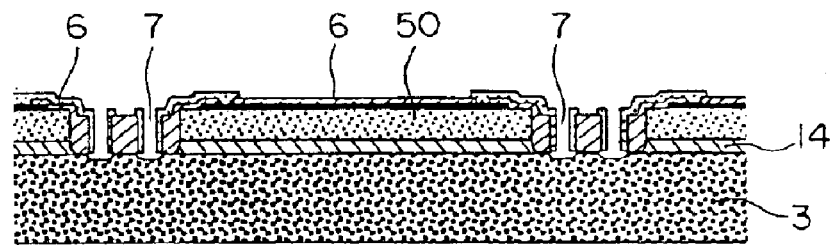
FIG. 18 is a cross sectional view showing a yet further process step in the course of manufacturing semiconductor devices by the use of the semiconductor device manufacturing method according to the third embodiment of the present invention.
Figure 19:
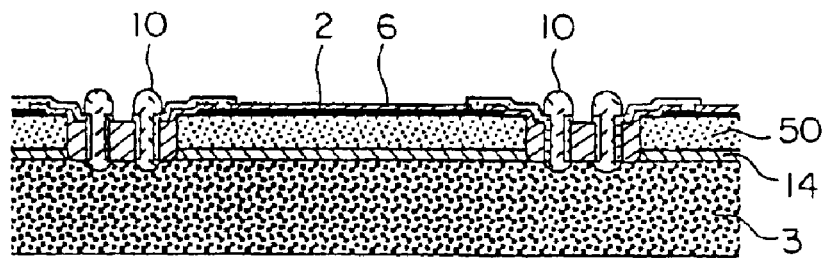
FIG. 19 is a cross sectional view showing a further process step in the course of manufacturing semiconductor devices by the use of the semiconductor device manufacturing method according to the third embodiment of the present invention.
Figure 20:
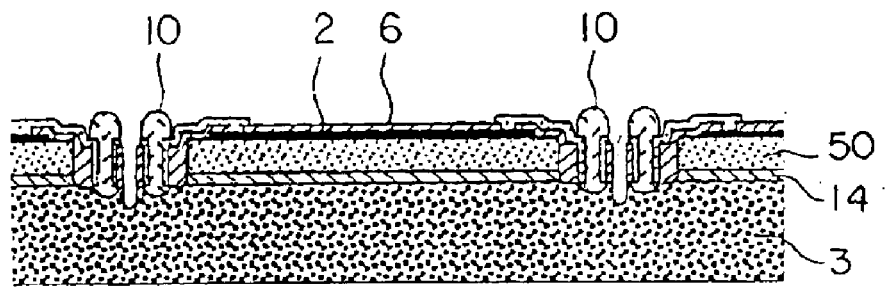
FIG. 20 is a cross sectional view showing a further process step in the course of manufacturing semiconductor devices by the use of the semiconductor device manufacturing method according to the third embodiment of the present invention.
Figure 21:
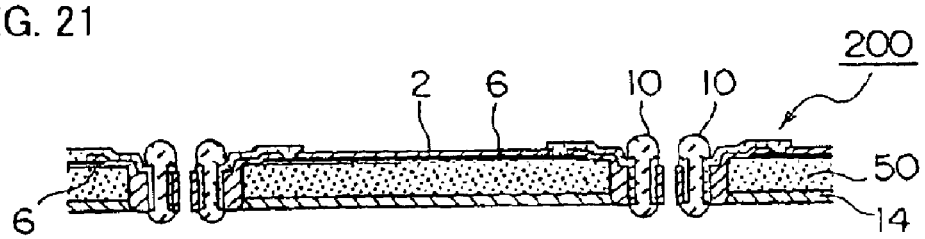
FIG. 21 is a cross sectional view showing a further process step in the course of manufacturing semiconductor devices by the use of the semiconductor device manufacturing method according to the third embodiment of the present invention.

In this embodiment, an insulating layer 14 is formed between the rear surface of the substrate proper 1 and the first support board 3 in the form of an aluminum metal plate, as shown in FIG. 14. This insulating layer 14 is formed of an adhesive or binding material like a polyimide precursor for instance. After the first support board 3 has been bonded to the rear surface of the substrate proper 1 by using this binding material, the insulating layer 14 is formed by thermally setting or hardening the binding material. The other manufacturing process steps are the same as those of the first embodiment. According to this embodiment, there are obtained semiconductor devices 350 each having the insulating layer 14 formed on the rear surface of each semiconductor substrate 50, as shown in FIG. 21.

In this embodiment, the rear surface of the substrate proper 1 and the support board 3 are bonded with each other through the binding material, which is then set or hardened to provide the insulating layer 14. Since the binding material remains on the rear surfaces of the semiconductor substrates 50 after removal of the support board 3, the binding material forms a stable insulating layer of each semiconductor device 350 as it is.

Embodiment 4.

FIG. 22 through FIG. 28 show the respective process steps of a method for manufacturing semiconductor devices according to a fourth embodiment of the present invention.

The manufacturing processes of this embodiment are the same as that of the first embodiment from the first step up to the third step shown in FIG. 3 in which the first support board 3 is adhered or bonded to the rear surface of the substrate proper 1.

Figure 22:
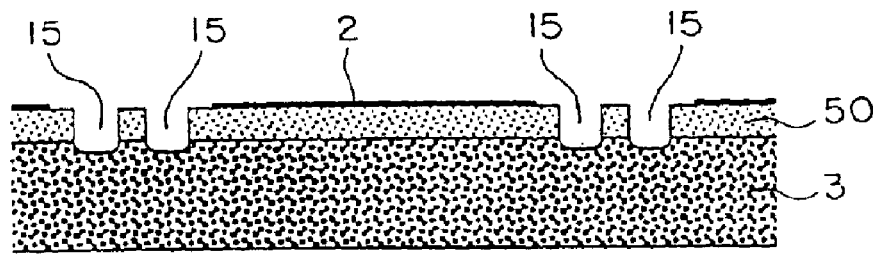
FIG. 22 is a cross sectional view showing one process step in the course of manufacturing semiconductor devices by the use of a semiconductor device manufacturing method according to a fourth embodiment of the present invention.

In this embodiment, after the third step, first groove portions 15, which reach the support board 3 in such a manner as to surround circuit element parts 2, are formed by means of dicing for instance, as shown in FIG. 22.

Figure 23:
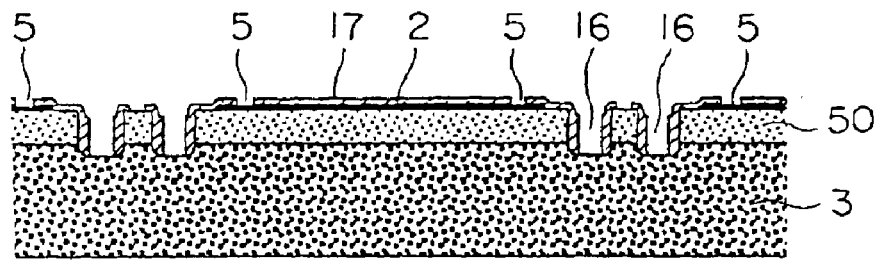
FIG. 23 is a cross sectional view showing another process step in the course of manufacturing semiconductor devices by the use of the semiconductor device manufacturing method according to the fourth embodiment of the present invention.

Thereafter, an insulating film 17 is formed on the surfaces of semiconductor substrates 50 by using, for instance, a photosensitive polyimide resin as an insulating material in such a manner that electrode portions 5 are exposed from the insulating film 17 at appropriate locations in the circuit element parts 2, as shown in FIG. 23. In addition, in the first groove portions 15, a plurality of holes 16 that reach the support board 3 are formed through the insulating film 17 by means of a photolithography process. Here, note that a photosensitive glass may be used instead of the photosensitive polyimide resin.

Figure 24:
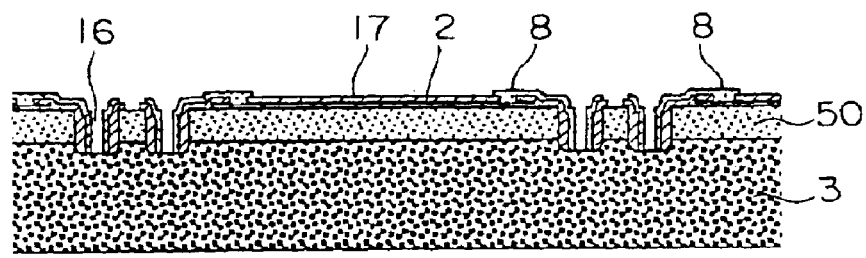
FIG. 24 is a cross sectional view showing a further process step in the course of manufacturing semiconductor devices by the use of the semiconductor device manufacturing method according to the fourth embodiment of the present invention.

Then, metal wiring patterns 8 are formed on the insulating film 17 in such a manner that they extend from the electrode portions 5 to at least parts of the inner walls of the corresponding holes 16, as shown in FIG. 24.

Figure 25:
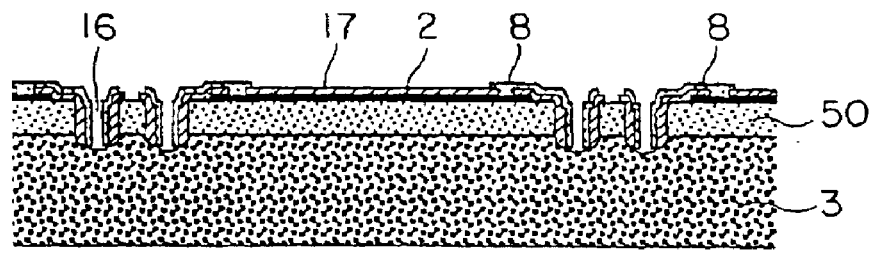
FIG. 25 is a cross sectional view showing a still further process step in the course of manufacturing semiconductor devices by the use of. the semiconductor device manufacturing method according to the fourth embodiment of the present invention.

Subsequently, a prescribed amount of the support board 3 exposed at the bottom of each hole 16 is removed by a wet etching process for instance, as shown in FIG. 25.

Figure 26:
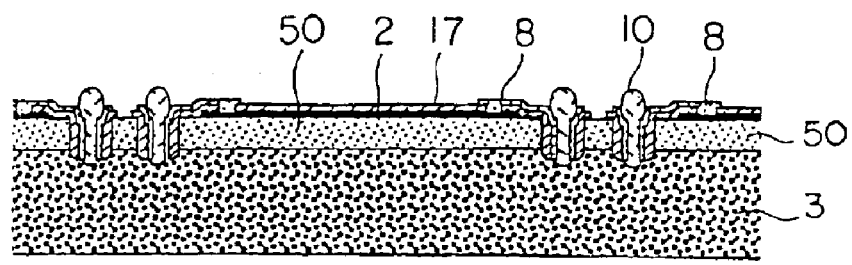
FIG. 26 is a cross sectional view showing a yet further process step in the course of manufacturing semiconductor devices by the use of the semiconductor device manufacturing method according to the fourth embodiment of the present invention.

Thereafter, a conductive metal such as a solder for instance is buried or filled into the holes 16 so as to protrude from the surface of the insulating film 17 by means of electroplating, for example, with the first support board 3 being made as a cathode, thus forming penetration electrodes 10, as shown in FIG. 26.

Figure 27:
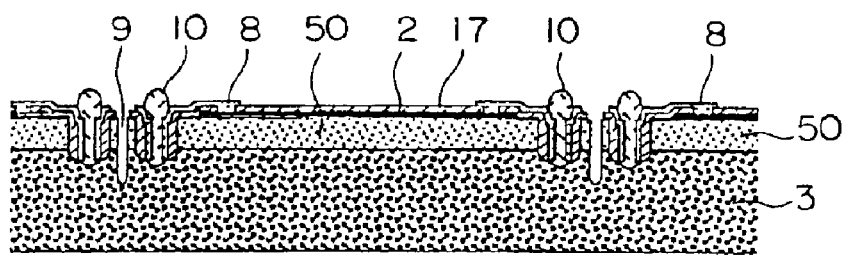
FIG. 27 is a cross sectional view showing a further process step in the course of manufacturing semiconductor devices by the use of the semiconductor device manufacturing method according to the fourth embodiment of the present invention.

Then, second groove portions 9 of a grid-like configuration, which reach the first support board 3, are formed along central lines of adjacent ones of the first groove portions 15 by using a dicing saw for instance, as shown in FIG. 27.

Figure 28:
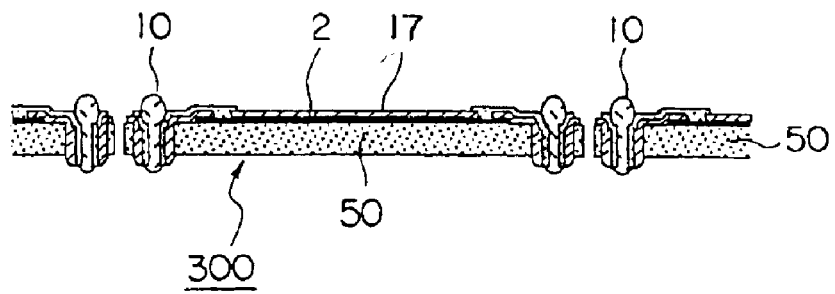
FIG. 28 is a cross sectional view showing a further process step in the course of manufacturing semiconductor devices by the use of the semiconductor device manufacturing method according to the fourth embodiment of the present invention.

Finally, the first support board 3 is removed by wet etching to produce a plurality of semiconductor devices 300 which have penetration electrodes 10 formed in their peripheral portions and extending from the obverse surface to the rear surface thereof, as shown in FIG. 28.

According to this embodiment, two rows of first groove portions 15 are respectively formed between adjacent ones of the circuit element parts 2, and one row of holes 16 are formed in each row of the first groove portions 15. Thus, since the second grooves 9 are formed in the substrate proper 1, a conventional blade or cutter can be used to cut the substrate proper 1 as compared with the method for manufacturing semiconductor devices according to the first embodiment. In addition, the peripheral portions of each of the semiconductor devices 300 are parts of an associated one of the semiconductor substrates 50, and hence the semiconductor devices 300 are higher in rigidity than the semiconductor devices 100, 200 of the first through third embodiments, thereby making it possible to protect the penetration electrodes 10 in the peripheral portions more effectively.

Embodiment 5.

FIG. 29 through FIG. 40 show the respective process steps of a method for manufacturing semiconductor devices according to a fifth embodiment of the present invention.

Figure 29:
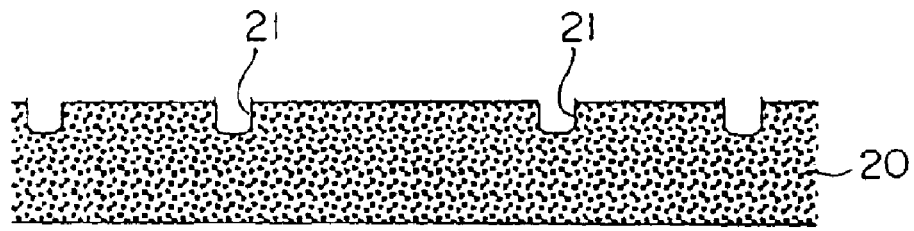
FIG. 29 is a cross sectional view showing one process step in the course of manufacturing semiconductor devices by the use of the semiconductor device manufacturing method according to a fifth embodiment of the present invention.

In this embodiment, first of all, holes 21 are formed through a support board 20 in the form of an aluminum metal plate, as shown in FIG. 29.

Figure 30:
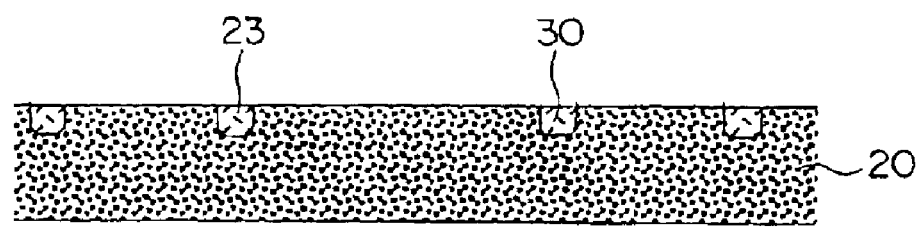
FIG. 30 is a cross sectional view showing another process step in the course of manufacturing semiconductor devices by the use of the semiconductor device manufacturing method according to the fifth embodiment of the present invention.

Then, an electrode material is filled into the holes 21 to form first projection electrodes 23, as shown in FIG. 30.

Figure 31:
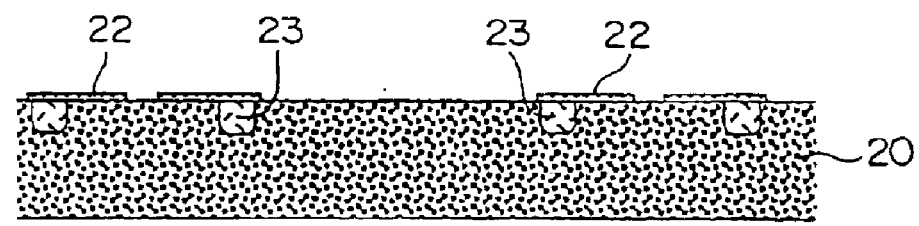
FIG. 31 is a cross sectional view showing a further process step in the course of manufacturing semiconductor devices by the use of the semiconductor device manufacturing method according to the fifth embodiment of the present invention.

Thereafter, first metal wiring patterns 22 connected to the first projection electrodes 23 are formed at prescribed positions of the support board 20, as shown in FIG. 31.

Figure 32:
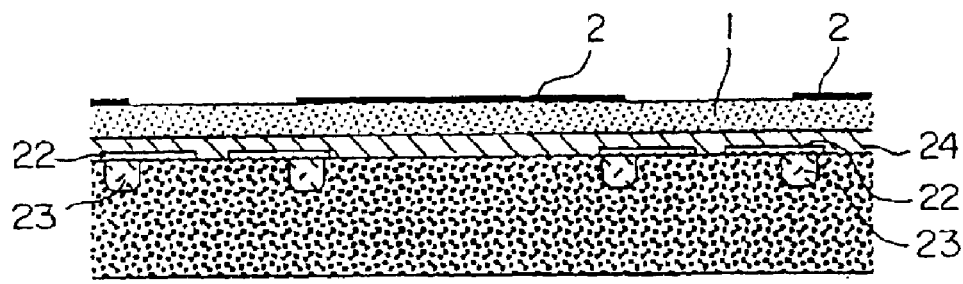
FIG. 32 is a cross sectional view showing a still further process step in the course of manufacturing semiconductor devices by the use of the semiconductor device manufacturing method according to the fifth embodiment of the present invention.

Subsequently, a substrate proper 1 having circuit element parts 2 formed thereon as illustrated in FIG. 2 is adhered to the first metal wiring patterns 22 by means of a binding material such as, for example, a polyimide resin, as shown in FIG. 32. This binding material is thermally set or hardened to form an insulating layer 24.

Figure 33:
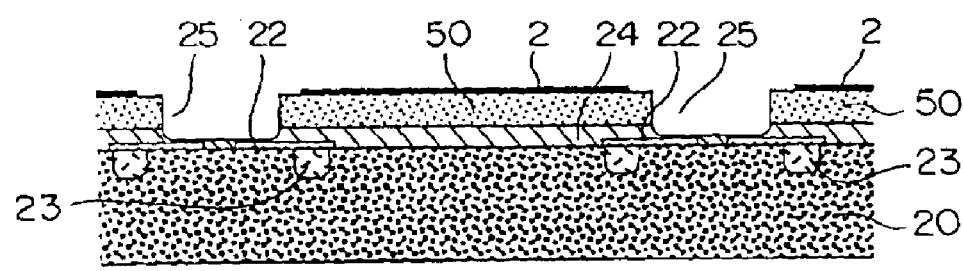
FIG. 33 is a cross sectional view showing a yet further process step in the course of manufacturing semiconductor devices by the use of the semiconductor device manufacturing method according to the fifth embodiment of the present invention.

Then, a plurality of first groove portions 25 of a grid-like configuration, which extend through the substrate proper 1 to locations near and before the first metal wiring patterns 22, are formed in areas of the substrate proper 1 between adjacent ones of the circuit element parts 2 by using dicing for instance, as shown in FIG. 33. By the formation of the first groove portions 25, the substrate proper 1 is divided into a plurality of semiconductor substrates 50.

Figure 34:
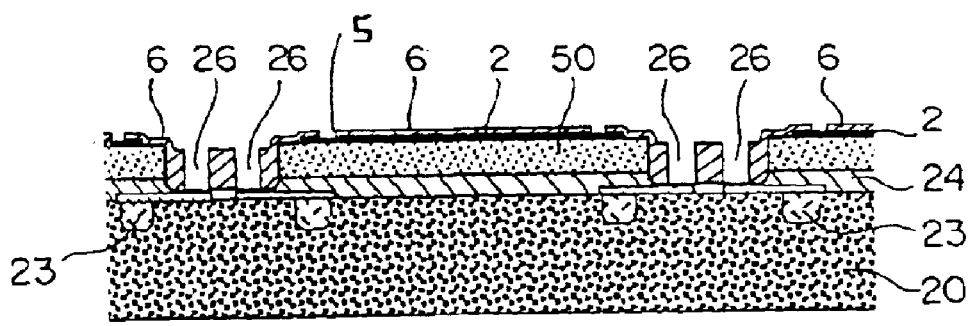
FIG. 34 is a cross sectional view showing a further process step in the course of manufacturing semiconductor devices by the use of the semiconductor device manufacturing method according to the fifth embodiment of the present invention.

Thereafter, an insulating film 6 is formed on the surfaces of the semiconductor substrates 50 by using, for instance, a photosensitive polyimide resin as an insulating material in such a manner that electrode portions 5 are exposed from the insulating film 6 at appropriate locations in the circuit element parts 2, as shown in FIG. 34. In addition, a plurality of holes 26 that reach the support board 20 are formed through the insulating film 6 in the first groove portions 25 by means of a photolithography process. Here, note that a photosensitive glass may be used instead of the photosensitive polyimide resin.

Figure 35:
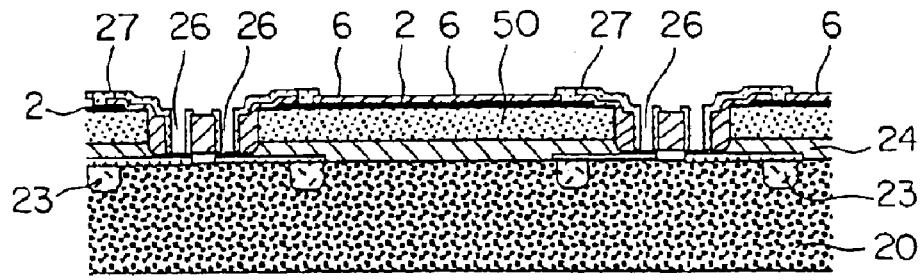
FIG. 35 is a cross sectional view showing a further process step in the course of manufacturing semiconductor devices by the use of the semiconductor device manufacturing method according to the fifth embodiment of the present invention.

Then, second metal wiring patterns 27 are formed on the insulating film 6 in such a manner that they extend from the electrode portions 5 to at least parts of the inner walls of the corresponding holes 26, as shown in FIG. 35.

Figure 36:
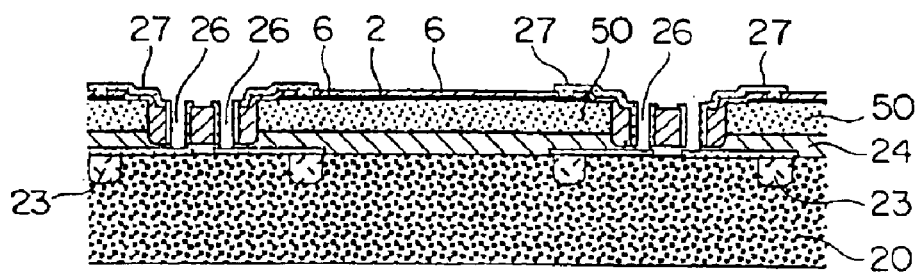
FIG. 36 is a cross sectional view showing a further process step in the course of manufacturing semiconductor devices by the use of the semiconductor device manufacturing method according to the fifth embodiment of the present invention.

Subsequently, the first metal wiring patterns 22 are exposed by removing the insulating layer 24 at the bottom of each hole 26, as shown in FIG. 36.

Figure 37:
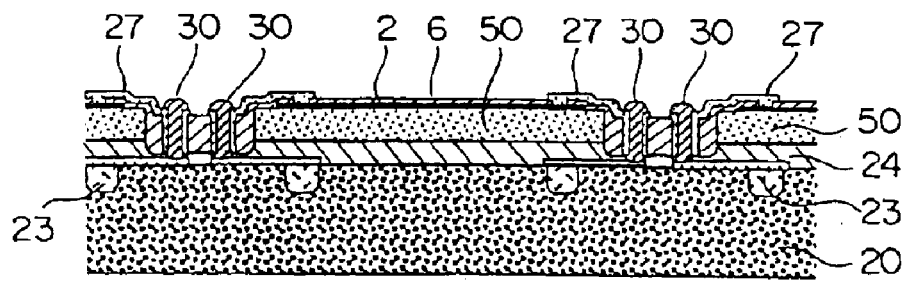
FIG. 37 is a cross sectional view showing a further process step in the course of manufacturing semiconductor devices by the use of the semiconductor device manufacturing method according to the fifth embodiment of the present invention.

Thereafter, a conductive metal such as a solder for instance is buried or filled into the holes 26 so as to protrude from the surfaces of the second metal wiring patterns 27 by means of electroplating, for example, with the support board 20 being made as a cathode, thus forming penetration electrodes 30, as shown in FIG. 37.

Figure 38:
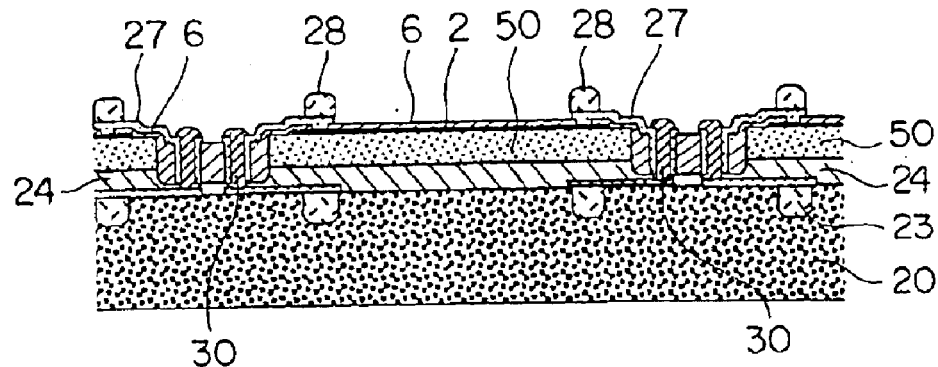
FIG. 38 is a cross sectional view showing a further process step in the course of manufacturing semiconductor devices by the use of the semiconductor device manufacturing method according to the fifth embodiment of the present invention.

Then, second projection electrodes 28 are arranged at prescribed locations on the second metal wiring patterns 27, as shown in FIG. 38.

Figure 39:
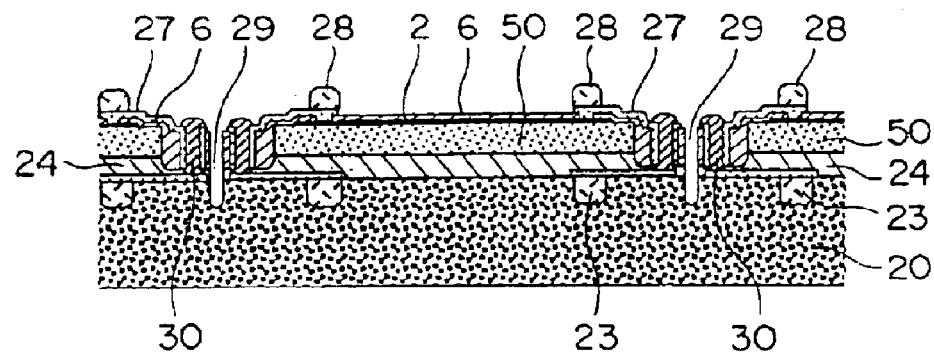
FIG. 39 is a cross sectional view showing a further process step in the course of manufacturing semiconductor devices by the use of the semiconductor device manufacturing method according to the fifth embodiment of the present invention.
Figure 40:
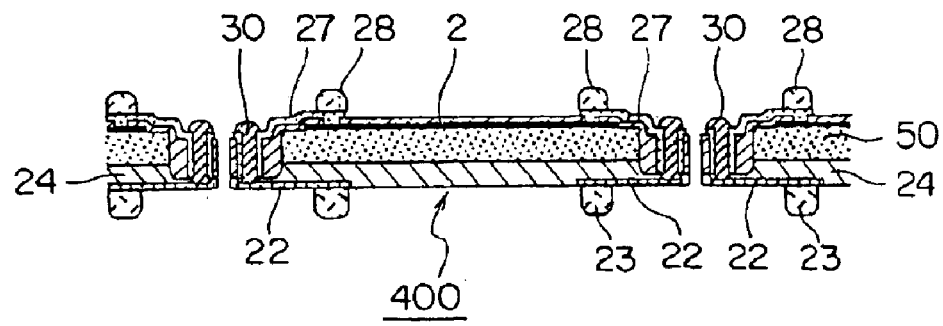
FIG. 40 is a cross sectional view showing a further process step in the course of manufacturing semiconductor devices by the use of the semiconductor device manufacturing method according to the fifth embodiment of the present invention.

After that, second groove portions 29 of a grid-like configuration, which reach the support board 20, are formed along central lines of the first groove portions 25 by using a dicing saw for instance, as shown in FIG. 39.

Finally, removing the support board 20 by means of wet etching, semiconductor devices 400 are produced each of which has second projection electrodes 28 and first projection electrodes 23 arranged on its obverse surface side and its rear surface side, respectively, and electrically connected with each other through the penetration electrodes 30.

According to this embodiment, it is possible to easily manufacture the semiconductor devices 400 each having the first projection electrodes 23 and the second projection electrodes 28 at the opposite sides thereof.

Embodiment 6.

Figure 41:
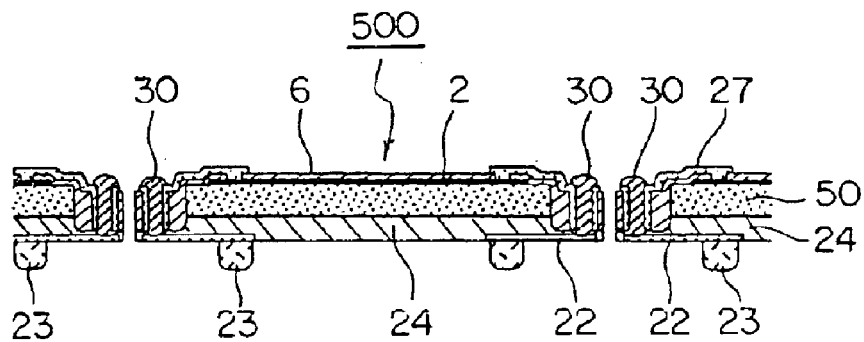
FIG. 41 is a cross sectional view showing one process step in the course of manufacturing semiconductor devices by the use of a semiconductor device manufacturing method according to a sixth embodiment of the present invention.
Figure 42:
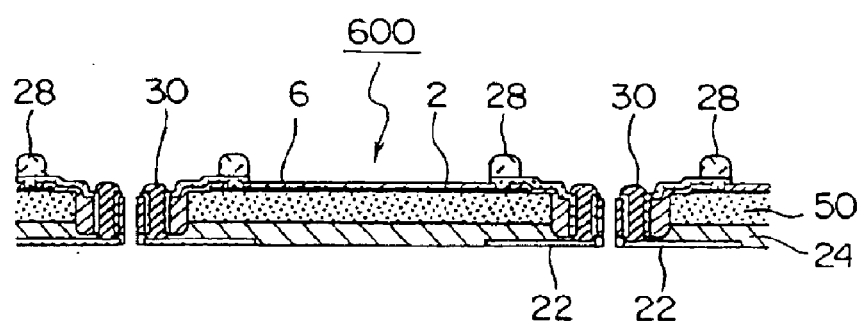
FIG. 42 is a cross sectional view showing another process step in the course of manufacturing semiconductor devices by the use of the semiconductor device manufacturing method according to the sixth embodiment of the present invention.
Figure 43:
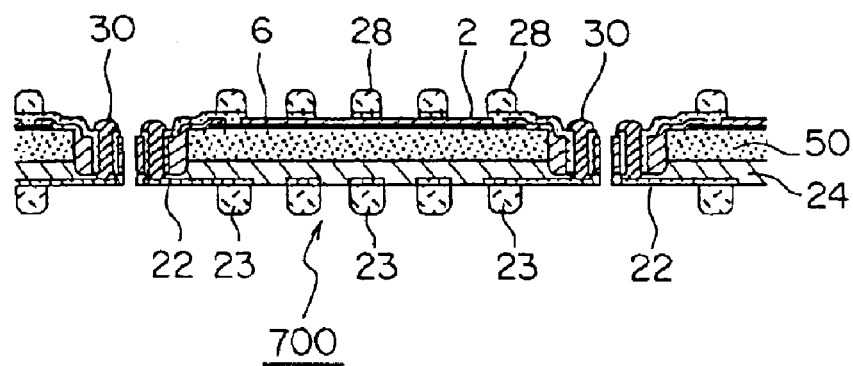
FIG. 43 is a cross sectional view showing a further process step in the course of manufacturing semiconductor devices by the use of the semiconductor device manufacturing method according to the sixth embodiment of the present invention.

FIG. 41 shows semiconductor devices 500 produced by a semiconductor manufacturing method according to a sixth embodiment of the present invention. The semiconductor devices 500 are similar to those of the fifth embodiment except for the second projection electrodes 28 being removed. FIG. 42 shows a modified form of semiconductor devices 600 in which the first projection electrodes 23 in the fifth embodiment are removed. FIG. 43 shows another modified form of semiconductor devices 700 in which second projection electrodes 28 are arranged on a circuit forming plane of each semiconductor substrate 50, and first projection electrodes 23 are arranged on an opposite side surface thereof.

Embodiment 7.

Figure 44:
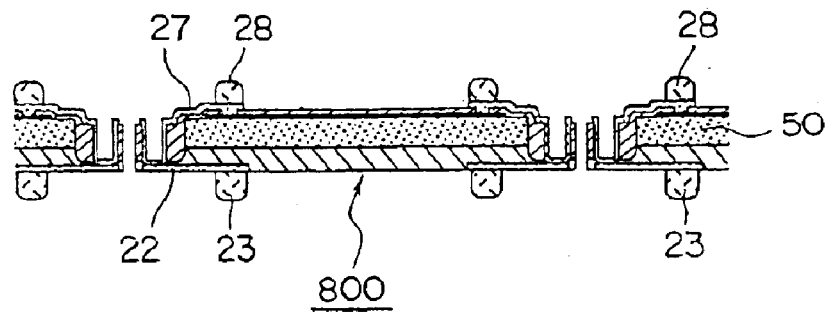
FIG. 44 is a cross sectional view showing one process step in the course of manufacturing semiconductor devices by the use of a semiconductor device manufacturing method according to a seventh embodiment of the present invention.
Figure 45:
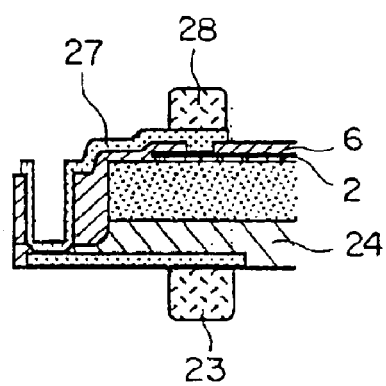
FIG. 45 is an enlarged view of essential portions of FIG. 44.

FIG. 44 is a cross sectional view of semiconductor devices 800 produced by a semiconductor manufacturing method according to a seventh embodiment of the present invention, and FIG. 45 is an enlarged view of essential portions of FIG. 44.

In this embodiment, the insulating layer 24 (see FIG. 40) at the bottom of each hole 26 embedded with a penetration electrode 30 in the abovementioned fifth embodiment is removed to expose the first metal wiring patterns 22 which serve as conduction paths. Thereafter, second metal wiring patterns 27, which serve as conduction paths, are formed in such a manner that the electrodes lying in parts of the circuit forming plane can reach at least parts of the inner walls of the corresponding holes 26. That is, in this embodiment, the step of exposing the first metal wiring patterns 22 and the step of forming the second metal wiring patterns 27 are exchanged with each other in comparison with the semiconductor devices 700 of the sixth embodiment shown in FIG. 43. In addition, there is no step of filling a metal into the holes 26 to form penetration electrodes 30.

Figure 46:
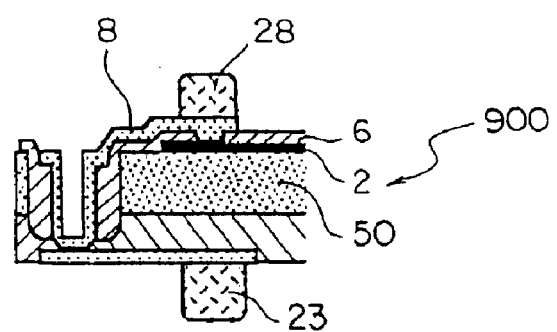
FIG. 46 is a cross sectional view similar to FIG. 45, but showing another example in the semiconductor device manufacturing method according to the seventh embodiment of the present invention.

Here, note that FIG. 46 shows a cross sectional view of a part of a semiconductor device 900 in which two rows of first groove portions 15 are respectively formed between adjacent ones of circuit element parts 2, and one row of holes 16 are formed in each row of the grooves 15.

The method for manufacturing semiconductor devices in the abovementioned first through seventh embodiments is as follows. Independently dispersed superfine particles, which are metal particles of about 3 to 30 nm in diameter covered with a surface active agent and dispersed in a solution, are attached by spin coating to the surfaces of the semiconductor substrates and the first groove portions, and then baked. Thereafter, the baked portions are partially removed to expose the electrode portions. Also, holes may be formed in the first groove portions. In this case, environmental impact due to waste water treatments or the like is limited, and the spin coating is compatible with the manufacturing processes for semiconductor devices.

Moreover, the process of filling the metal of a conductive material into the holes may be carried out by means of electroless plating. In this case, the filling process requires only a short time and is simple and convenient.

Further, an electroconductive paste may be used as the conductive material filled in the holes. In this case, the filling process can be simplified.

Furthermore, the filling into the holes of the conductive material can be performed by screen printing and baking independently dispersed superfine particles, which are metal particles of about 3 to 30 nm in diameter covered with a surface active agent and dispersed in a solution.

Still further, the filling into the holes of the conductive material can also be performed by a gas deposition method in which superfine metal particles generated in a gas atmosphere by a deposition process are sprayed from nozzles directed toward the holes above the semiconductor substrates mounted on a stage in a decompression chamber. In this case, the time required of the filling process is short, and the filling material can be used without wastefulness, and its environmental impact is limited.

Besides, a metal film may be deposited on the entire surfaces of the semiconductor substrates and the first groove portions, and a metal is then buried or filled into the holes by electroplating with the metal film being made as a cathode, after which metal wiring patterns can be formed. In this case, it is not necessary to use a metal (conductor) as the support board when electroplating is carried out to fill the metal into the holes.

In addition, after a prescribed amount of insulating layer at the bottom of each hole has been removed, the metal wiring patterns extending from the electrode portions to the bottom of each hole may be formed. In this case, the reliability of the electrical connections is improved.

Moreover, the first groove portions may be formed in the corresponding circuit element parts by means of reactive ion etching, and the projection electrodes may be arranged at locations other than the peripheral portions of each semiconductor device.

Embodiment 8.

Figure 47:
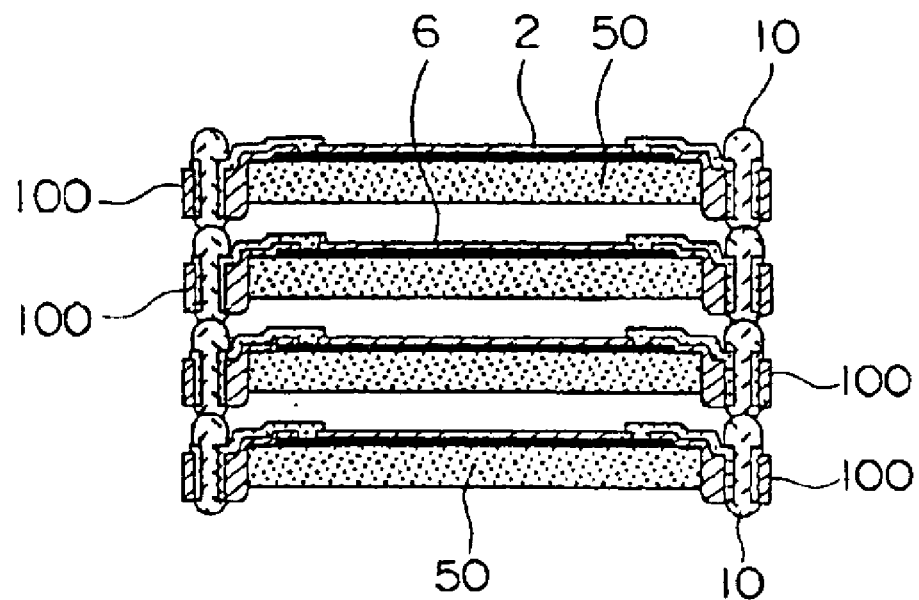
FIG. 47 is a cross sectional view of electronic equipment according to an eighth embodiment of the present invention.

FIG. 47 is a cross sectional view of electronic equipment in which semiconductor devices 100 produced by the semiconductor manufacturing method according to the abovementioned first embodiment are stacked or laminated in a plurality of stages with penetration electrodes 10 being connected with each other. According to this embodiment, the electronic equipment with a high level of integration (high packing density) and high performance can be obtained.

Embodiment 9.

Figure 48:
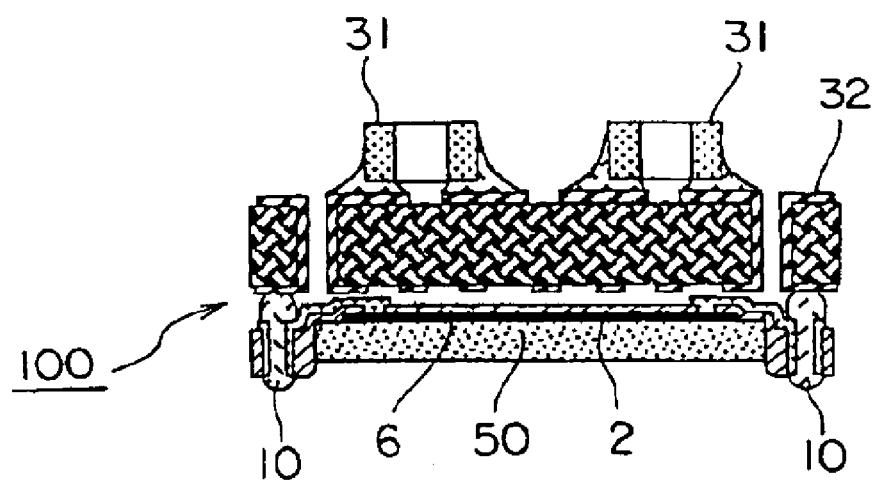
FIG. 48 is a cross sectional view of electronic equipment according to a ninth embodiment of the present invention.

FIG. 48 shows a cross sectional view of electronic equipment having a circuit function in which a small-sized circuit board 32 with passive elements 31 such as, for instance, chip capacitors mounted thereon is connected and integrated with penetration electrodes 10 of a semiconductor device 100 that is produced by the semiconductor manufacturing method according to the abovementioned first embodiment. In this case, the electronic equipment can be reduced in size as compared with conventional so-called hybrid ICs.

Embodiment 10.

Figure 49:
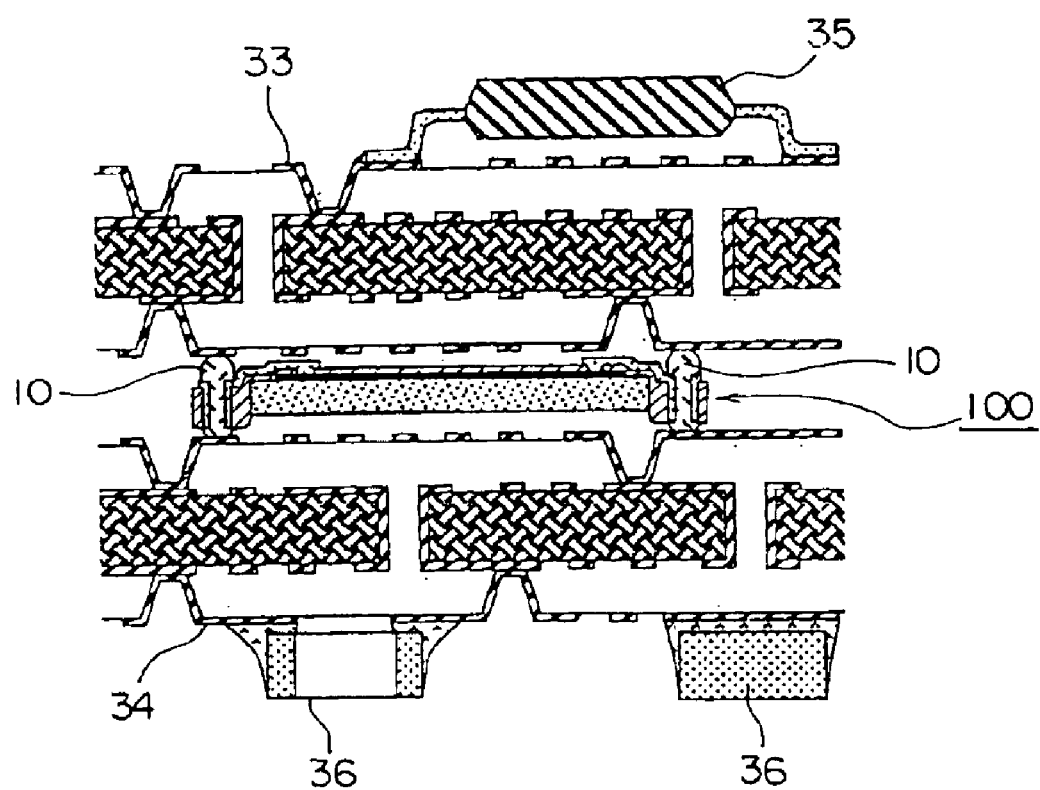
FIG. 49 is a cross sectional view of electronic equipment according to a tenth embodiment of the present invention.

FIG. 49 shows a cross sectional view of electronic equipment in which a first circuit board 33 having an electronic part 35 and a second circuit board 34 having electronic parts 36 are connected with penetration electrodes 10 of a semiconductor device 100 from opposite sides (an obverse side and a rear side) thereof, which is produced by the semiconductor manufacturing method according to the abovementioned first embodiment. In this case, the electronic equipment is of a three-dimensional connection structure and hence can be obtained with a high degree of freedom and a high level of integration.

Embodiment 11.

Figure 50:
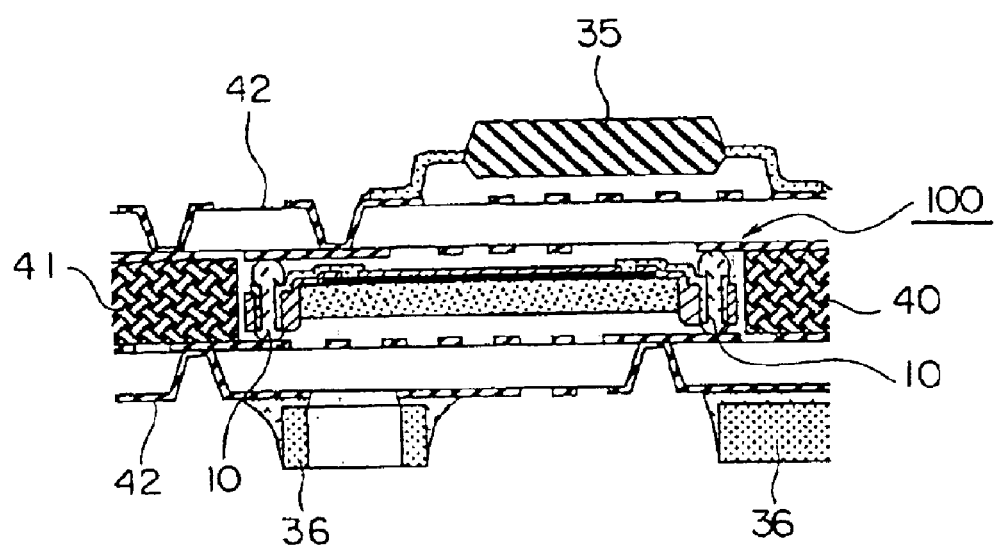
FIG. 50 is a cross sectional view of electronic equipment according to an eleventh embodiment of the present invention.

FIG. 50 is a partial cross sectional view of electronic equipment in which a semiconductor device 100 produced according to the manufacturing method of the first embodiment is buried or embedded in a core 41 of a circuit board 40, and wiring layers 42 on the opposite sides of the circuit board 40 are connected with the opposite end faces of the penetration electrodes 10. In this case, too, the electronic equipment is of a three-dimensional connection structure and hence can be obtained at a reduced size with a high degree of freedom and a high level of integration. In addition, there is also achieved an advantageous effect that wiring delays can be decreased.

Although in the eighth through eleventh embodiments, the few pieces of electronic equipment incorporating therein a semiconductor device 100 produced by the semiconductor manufacturing method according to the first embodiment have been described, these eighth through eleventh embodiments can of course be applied to the semiconductor devices 200, 300, 400, 500, 600, 700 and 800 produced by the semiconductor manufacturing methods according to the first through seventh embodiments, respectively, as well as the semiconductor devices produced by semiconductor manufacturing methods according to twelfth through eighteenth embodiments, respectively, which will be described later.

Embodiment 12.

FIG. 51A through FIG. 51G show the respective process steps of a method for manufacturing semiconductor devices according to a twelfth embodiment of the present invention.

Hereinafter, the procedure for manufacturing semiconductor devices according to this embodiment will be described based on these figures.

Figure 51:
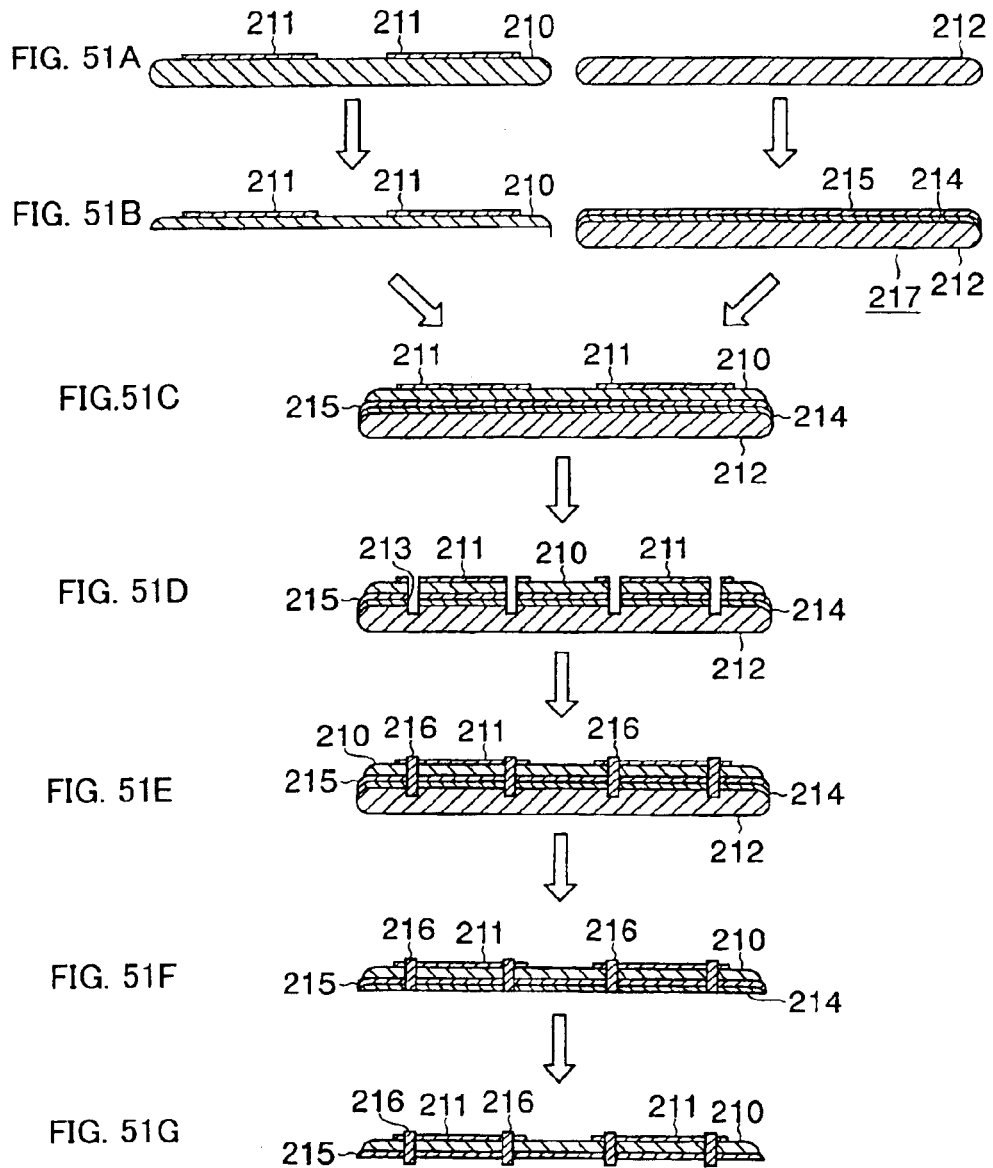
FIGS. 51A through FIG. 51G are views showing respective process steps in a semiconductor device manufacturing method according to a twelfth embodiment of the present invention.

First of all, a substrate proper 210 is produced which has a plurality of circuit element parts 211 of prescribed functions arranged on a circuit forming plane on an obverse surface thereof, as shown in FIG. 51A. Also, a support board base member 212 in the form of a silicon wafer is prepared in advance (first step).

Then, the rear surface of the substrate proper 210 formed of a silicon wafer at the opposite side of the circuit forming plane is ground up to a thickness that is thinner than the depth of holes 213 formed in a post-processing trench etching process, as shown in FIG. 51B. On the other hand, for instance, an Al film is formed on one surface of the support board base member 212 to provide an intermediate layer 214. In addition, an insulating film 215 made of $SiO_2$ or alumina for instance is formed on the surface of the intermediate layer 214 to produce a support board 217 (second step).

Thereafter, the support board 217 and the ground thin substrate proper 210 are joined to each other by anode bonding, as shown in FIG. 51C (third step). At this time, materials such as. PSG (phosphosilicate glass), BSPSG (brophosphosilicate glass) or the like adhere to the surface of the insulating film 215. In so doing, phosphorus or boron is doped into the insulating film 215, so that electric charges become easy to be induced on the surface of the insulating film 215, thereby facilitating the anode bonding. Moreover, not only the surface of the insulating film but also the insulating film itself can be formed of these materials.

Here, note that in case of the anode bonding in the previous embodiments, the surface of the insulating film or the insulating film itself can be formed of such a material as PSG or BSPSG.

Then, an etching treatment from the circuit element parts 211 to a depth of about 100 $\mu$m that reaches the support board base member 212 is performed, as shown in FIG. 51D (fourth step).

Thereafter, an insulating film is formed on the inner wall surface of each hole 213, and then a metal film, which becomes a cathode for electroplating, is deposited on the insulating film, as shown in FIG. 51E. After that, a penetration electrode 216 made of a conductive material is formed in each hole 213 by means of electroplating with the metal film being made as a cathode.

Thereafter, the support board base member 212 is removed, as shown in FIG. 51F. In addition, the rear end faces of the penetration electrodes 216 are removed so as to be flush with the surface of the intermediate layer 214 (fifth step). At this time, the rear end faces of the penetration electrodes 216 are flattened.

Finally, the intermediate layer 214 is completely removed by etching to provide a semiconductor device assembly in which the penetration electrodes 216 protrude from the rear surface of the substrate proper 210, as shown in FIG. 51G. The semiconductor device assembly is divided into a plurality of individual pieces to produce semiconductor devices (sixth step). In this process step, the etching treatment is performed on the intermediate layer 214 alone, and it does not extend to the insulating film 215. As a consequence, the insulating film 215 is transferred on the rear surface of the substrate proper 210. Moreover, for the support board base member 212 and the intermediate layer 214 which are subjected to etching processing, there are selectively used materials that can be easily etched.

In the semiconductor devices produced according to the abovementioned process steps, the substrate proper 210 is supported by the support board base member 212 in the course of manufacture, and hence the formation of an insulating film after removal of a support board and the formation of openings or holes for the penetration electrodes, which are conventionally required, become no longer unnecessary. Therefore, it is possible to form the penetration electrodes 216 that protrude from the rear surface of the substrate proper 210, by the use of simple process steps (see FIG. 51F and FIG. 51G) alone which do not require high machining or processing accuracy. As a result, the damage of the substrate proper 210 in the manufacturing processes is reduced, thus making it possible to improve the product yield of the semiconductor devices.

Further, the provision of the insulating film 215 on the rear side of the substrate proper 210 serves to prevent the characteristics of the semiconductor devices from being deteriorated, which would otherwise be caused due to electrode materials remaining on the rear surface of the substrate proper and diffusing into the substrate proper to form an unexpected energy level at the time of removal at the rear side of the substrate proper.

Furthermore, anode bonding is used for the connection between the support board base member 212 and the substrate proper 210 without any dissimilar material being interposed therebetween, thereby making it easy to form the holes 213 by etching.

Still further, common materials including Si for the support board base member 212. Al for the intermediate layer 214, and $SiO_2$ for the insulating film 215 are employed which are generally used in current semiconductor manufacturing processes, and for which processing technologies have accordingly been highly developed and fully established. As a result, the yield of the products can be improved, and the manufacturing cost can be reduced.

Figure 52:
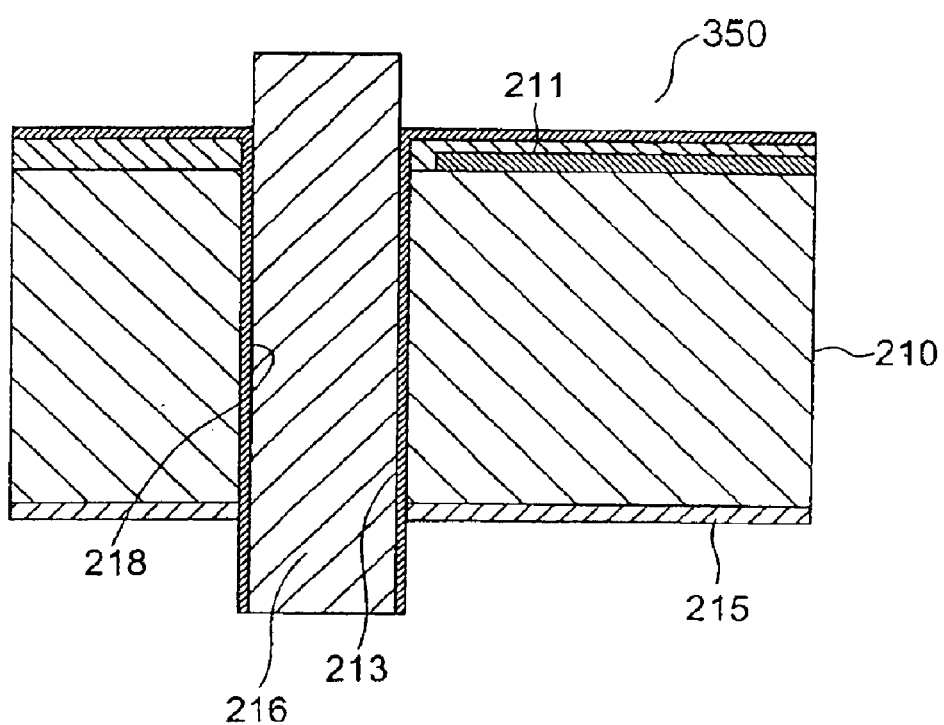
FIG. 52 is a cross sectional view of essential portions of a semiconductor device produced according to the manufacturing method of FIG. 51.

FIG. 52 is a cross sectional view of essential portions of a semiconductor device 350 produced by the method shown in FIGS. 51A through 51G.

As shown in this figure, the holes 213 (though only one is illustrated) in the substrate proper 210 are formed substantially perpendicularly to the circuit forming plane, and a penetrating insulating film 218 is formed on the vertical wall of each hole 213. A penetration electrode 216 extends through each hole 213 with its opposite ends being protruded from the corresponding hole 213. The insulating film 215 is formed on the rear side of the substrate proper 210 except for the lower end faces of the penetration electrodes 216. The insulating film 215 and the penetrating insulating film 218 of each hole 213 intersect perpendicularly with respect to each other.

In each semiconductor device 350 according to the twelfth embodiment, the rear surface of the substrate proper 210 is not exposed between the penetration electrodes 216 and the substrate proper 210, and hence there is no problem of insulation between them. Additionally, the insulating film 215 does not run on the end faces of the penetration electrodes 216, so no problem arises in the electrical connectivity of the penetration electrodes.

Moreover, the lower end faces of the plurality of penetration electrodes 216 that penetrate through the substrate proper 210 are flat and substantially in parallel to the circuit forming plane of the substrate proper 210. In addition, the amounts of protrusion of the respective penetration electrodes 216 from the insulating film 215 of the substrate proper 210 are substantially constant or equal to each other. As a result, electrical connectivity between semiconductor devices, which are stacked or laminated one over another and electrically connected with one another, is good.

Embodiment 13.

FIG. 53A through FIG. 53G show the respective process steps of a method for manufacturing semiconductor devices according to a thirteenth embodiment of the present invention.

Hereinafter, a manufacturing procedure for semiconductor devices according to this embodiment will be explained based on these figures.

Figure 53:
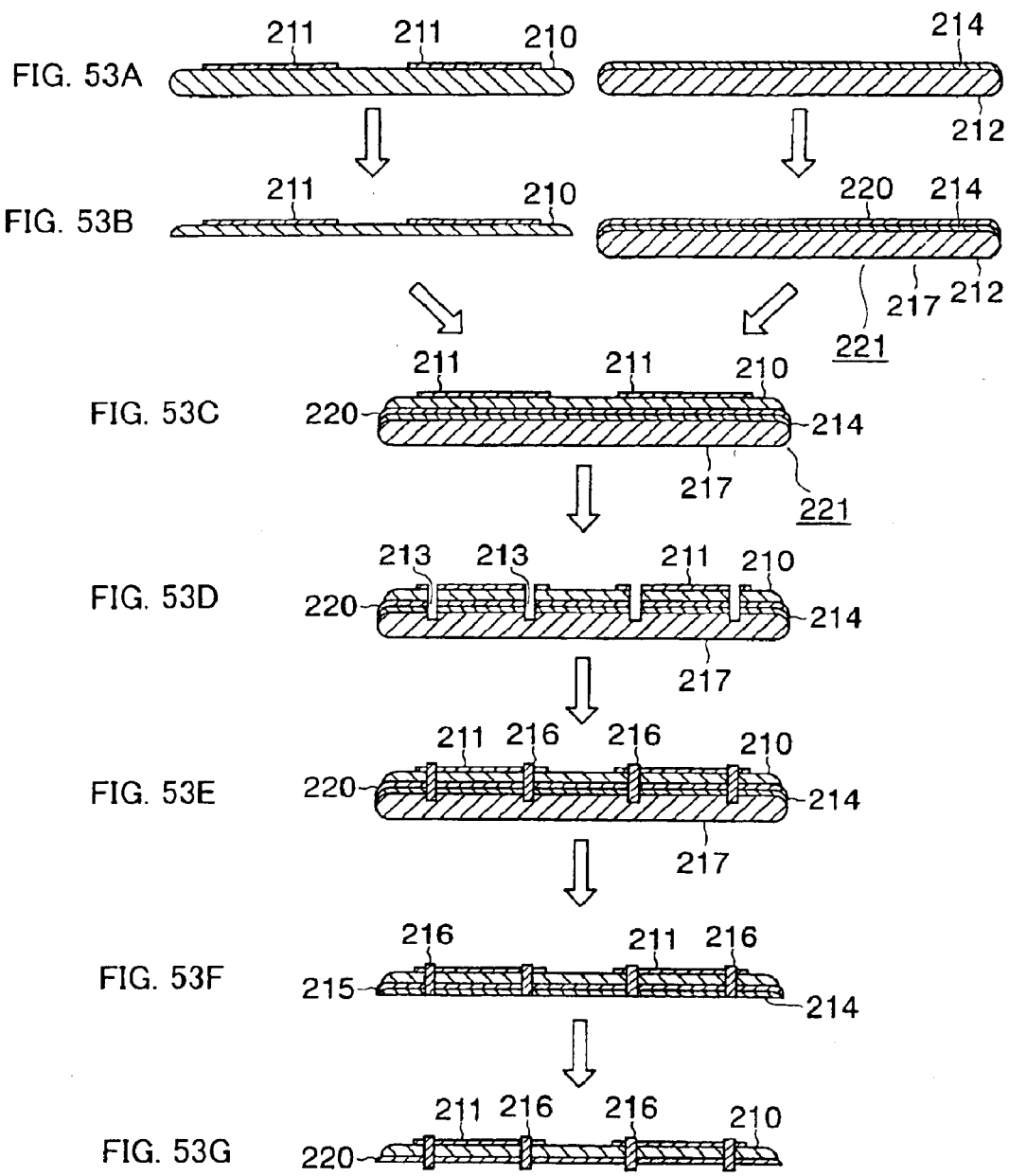
FIGS. 53A through FIG. 53G are views showing respective process steps in a semiconductor device manufacturing method according to a thirteenth embodiment of the present invention.

First of all, a substrate proper 210 is produced which has a plurality of circuit element parts 211 of prescribed functions arranged on a circuit forming plane on an obverse surface thereof, as shown in FIG. 53A. Also, an intermediate film 214 in the form of an Al film is formed on one surface of a support board base member 212 in the form of a silicon wafer (first step).

Then, the rear surface of the substrate proper 210 at the opposite side of the circuit forming plane is ground up to a thickness that is thinner than the depth of holes 213 formed in a post-processing trench etching process, as shown in FIG. 53B. On the other hand, an adhesive or binding material made of a polyimide resin, which later forms an insulating film, is coated on a surface of the intermediate film 214 of the support board base member 212 to form a support board 221 (second step).

Thereafter, the ground thin substrate proper 210 is adhered to the support board 221 by setting or hardening the adhesive, as shown in FIG. 53C (third step).

Subsequently, semiconductor devices are produced according to the procedure as shown in FIG. 53D through FIG. 53G, whose respective steps are similar to those of FIG. 51D through FIG. 51G described with reference to the twelfth embodiment.

In the semiconductor devices according to this embodiment, the adhesive in the form of the polyimide resin or polyimide resin precursor is used in place of the anode bonding employed in the semiconductor devices of the twelfth embodiment.

Though anode bonding is technically advanced and accordingly high in process cost, the use of the polyimide resin can serve to reduce the process cost.

Embodiment 14.

FIG. 54A through FIG. 54G show the respective process steps of a method for manufacturing semiconductor devices according to a fourteenth embodiment of the present invention.

This embodiment is different from the method for manufacturing semiconductor devices according to the twelfth embodiment in the absence of the intermediate layer 214. That is, in comparison with the support board 217 of the twelfth embodiment which has the intermediate layer 214 and the insulating film 215 stacked or laminated on the support board base member 212, a support board 230 of this fourteenth embodiment has an insulating film 215 formed on an upper surface of a support board base member 212, as a result of which process steps of FIG. 54B through FIG. 54F are different from those of FIGS. 51B through 51F.

Here, note that in this embodiment, too, the support board base member 212 is joined to a substrate proper 210 by anode bonding. In addition, an insulating film is formed on the inner wall surface of each hole 213, and then a metal film, which later becomes a cathode for electroplating, is deposited on the insulating film, and a penetration electrode 216 is formed in each hole 213 by electroplating with this metal film being made as a cathode.

In this embodiment, there is formed no intermediate layer such as one 214 shown in FIGS. 51B through 51F, which becomes a mark for grinding. Therefore, grinding at the rear side of the substrate proper 210 should be stopped in a state where the insulating film 215 has not yet been reached, as shown in FIG. 53F. Accordingly, the extent of grinding has to be controlled only by the dimension or depth of grinding, and hence a higher degree of grinding accuracy is required. However, the process step of forming the intermediate layer 214 becomes unnecessary, and hence the entire manufacturing processes can be simplified.

Note that an Al wafer can be used as the support board base member 212 in place of an Si wafer. Thus, etching becomes easy, and there can be obtained the same operation and effect as those achieved by the semiconductor devices according to the twelfth embodiment.

Moreover, by stopping grinding the rear surface of the support board base member 212 at the stage where the penetration electrodes 216 are not exposed from the rear surface, and thereafter completely removing the support board base member 212 by means of etching, the penetration electrodes 216 may be automatically protruded from the rear side of the substrate proper 210. This does not require high grinding accuracy.

Figure 54:
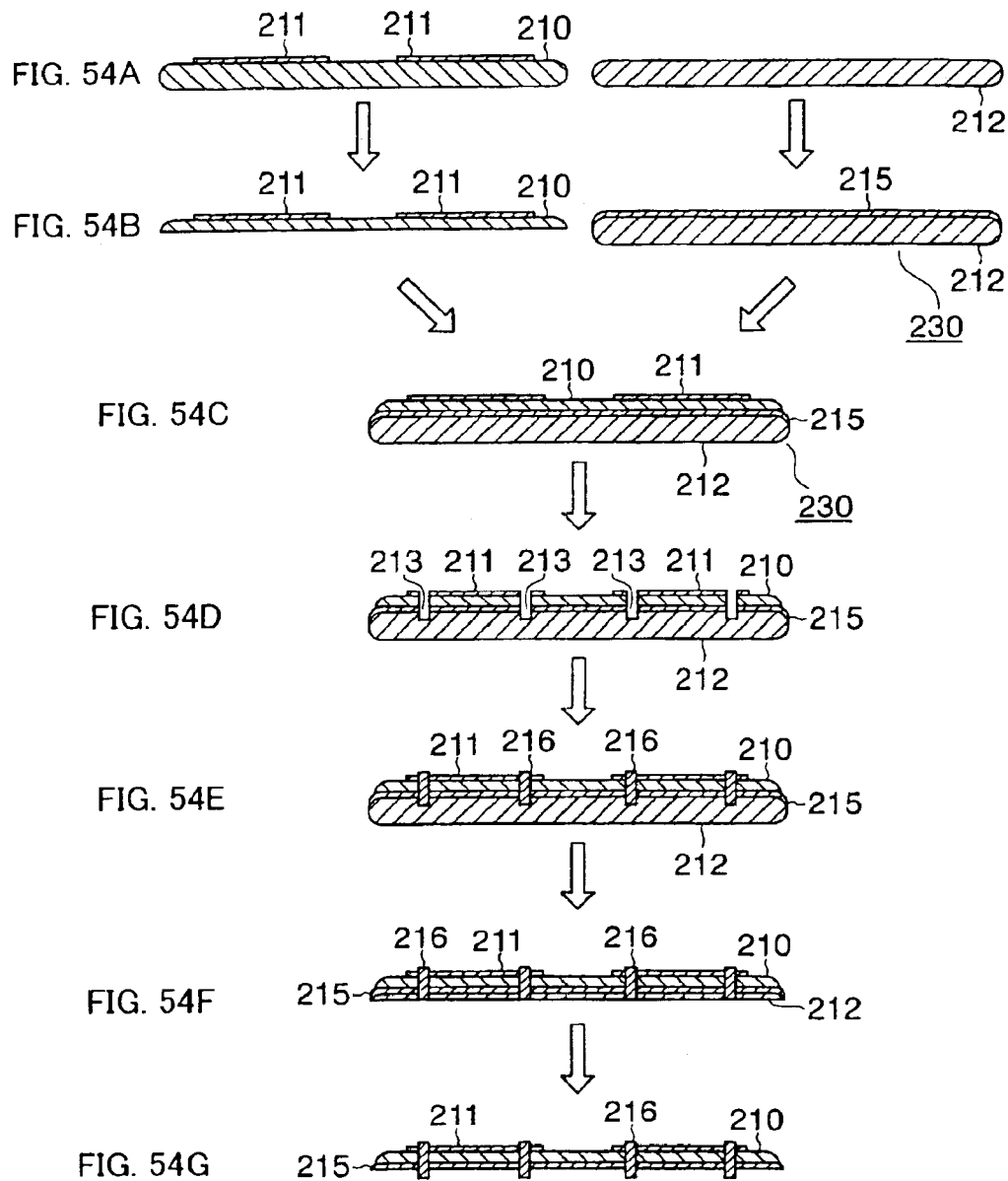
FIGS. 54A through FIG. 54G are views showing respective process steps of a semiconductor device manufacturing method according to a fourteenth embodiment of the present invention.

However, the amount of projection of each penetration electrode 216 from the insulating film 215 depends greatly on the etch depth and uniformity of trench etching of FIG. 54D. Therefore, uniformity in the projection amounts is not so good and the flatness of the end face of each protruded penetration electrode 216 is also rather poor.

Note that even in case of the support board which does not have the intermediate layer 214 and the insulating film 215 but consists of the support board base member 212 alone, it is possible to produce semiconductor devices with penetration electrodes.

That is, in this case, such semiconductor devices can be produced according to the following procedure.

First, the rear surface of a substrate proper 210 shown in FIG. 54B is joined to the obverse surface of a support board base member 212 by a polyimide resin, and then the polyimide resin is set or hardened to form an insulating film 215. Subsequently, holes 213 extending from the circuit forming plane to the support board base member 212 are formed, and a penetration insulating film is formed on the inner side wall of each hole 213. Thereafter, a conductive material is buried or filled into the holes 213 to form penetration electrodes 216. Then, the support board base member 212 is removed while leaving the insulating film 215, whereby the rear ends of the penetration electrodes 216 are protruded from the insulating film 215, thus providing a semiconductor device assembly. Finally, the semiconductor device assembly thus produced is divided into a plurality of semiconductor devices.

Embodiment 15.

FIG. 55A through FIG. 55G show the respective process steps of a method for manufacturing semiconductor devices according to a fifteenth embodiment of the present invention.

In comparison with the method for manufacturing semiconductor devices according to the twelfth embodiment, this embodiment differs therefrom in that a substrate proper 240 is formed of an SOI (silicon on insulator) wafer having a buried or embedded oxide film 241, and in that no insulating film is formed on the inner wall surfaces of holes 213 upon formation of penetration electrodes 216.

Figure 55:
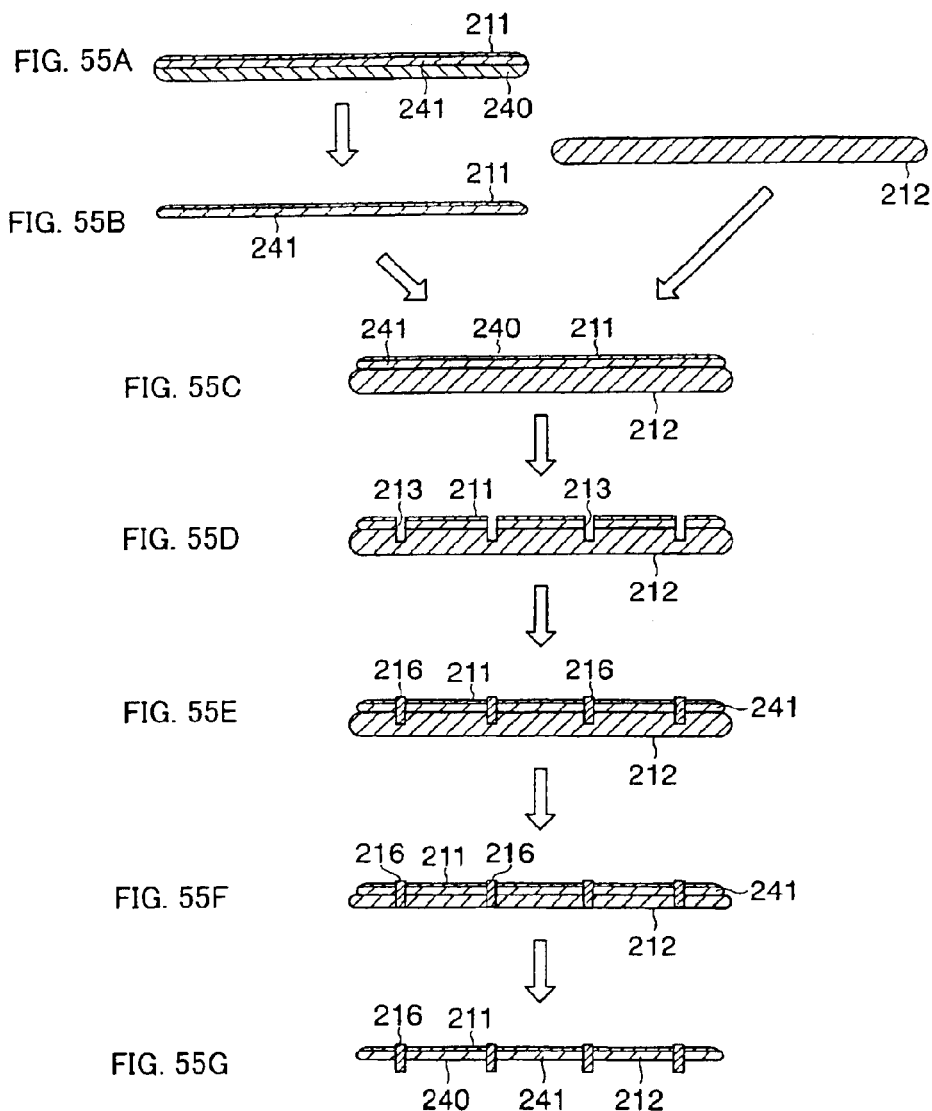
FIGS. 55A through FIG. 55G are views showing respective process steps of a semiconductor device manufacturing method according to a fifteenth embodiment of the present invention.

In this embodiment, the rear surface of the substrate proper 240, which has circuit element parts 211 formed thereon, is processed by mechanical grinding, chemical mechanical polishing, etching or combinations thereof until the total thickness of the substrate proper 240 including the circuit element parts 211 and the buried oxide film 241 comes to a thickness of about a few microns, so that the one side of the buried oxide film 241 can be exposed (see FIG. 55B).

After this, the substrate proper 240 and a support board base member 212 are joined to each other by anode bonding (see FIG. 55C), and holes 213 reaching the support board base member 212 are formed through the circuit element parts 211 and the buried oxide film 241 (see FIG. 55D).

Then, a metal film, which later becomes a cathode for electroplating, is formed on the inner wall surface of each hole 213, and penetration electrodes 216 are formed in the holes 213 by electroplating (see FIG. 55E).

Thereafter, the support board base member 212 is ground until one end face of each penetration electrode 216 is exposed (see FIG. 55F).

Subsequently, the support board base member 212 is completely removed by etching to provide a semiconductor device assembly, which is then divided into a plurality of pieces to produce individual semiconductor devices (see FIG. 55G).

Here, note that an intermediate layer 214 or the like may be formed as necessary.

In the semiconductor devices according to this embodiment, the buried oxide film 241 of the substrate proper 240 corresponds to the insulating film 215 of the above-mentioned twelfth embodiment. Therefore, since the process step of forming the insulating film 215 on a surface of the support board base member 212 is unnecessary, as will be described in the following, not only the entire manufacturing processes can be simplified, but also the insulation performance of the penetration electrodes 216 can be improved.

In addition, the substrate proper 240 is formed of the SOI wafer, and hence operates at high speed since the SOI wafer itself operates at higher speed as compared with conventional wafers. Thus, in combination with shortened transmission paths due to mutual electrical connections between elements through the penetration electrodes (stacked or laminated mounting structure), there can be provided electronic equipment capable of higher speed operation.

Figure 56:
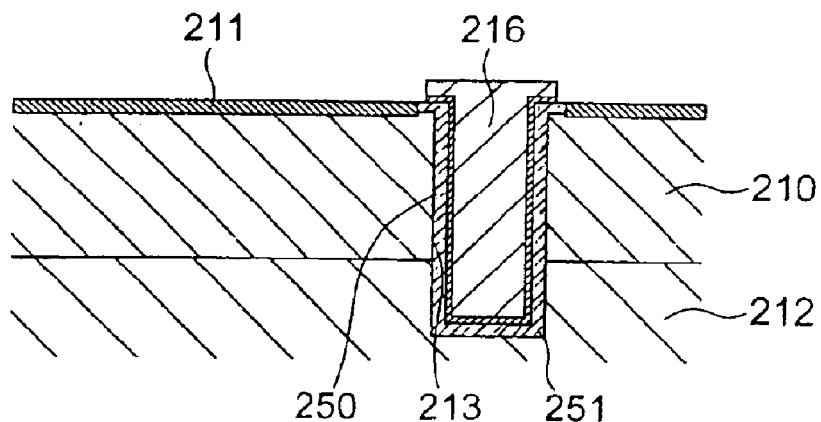
FIG. 56 is a view showing how a penetration electrode is arranged in a substrate proper using an ordinary wafer.
Figure 57:
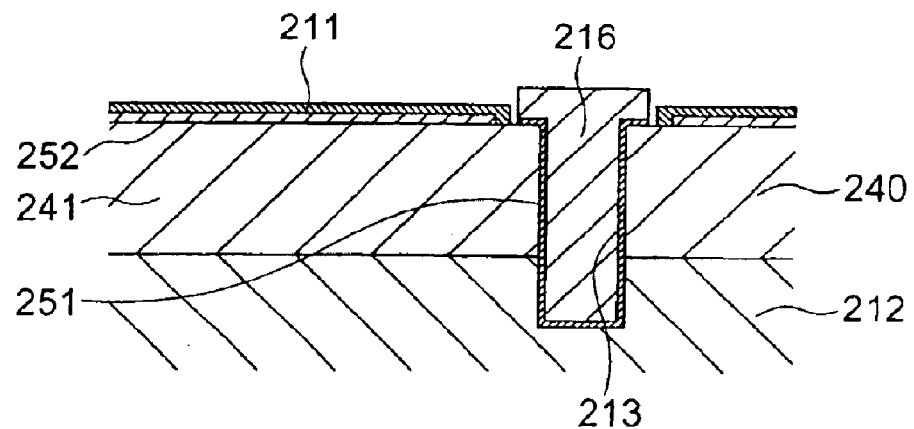
FIG. 57 is a view showing how a penetration electrode is arranged in a substrate proper using an SOI wafer.
Figure 58:
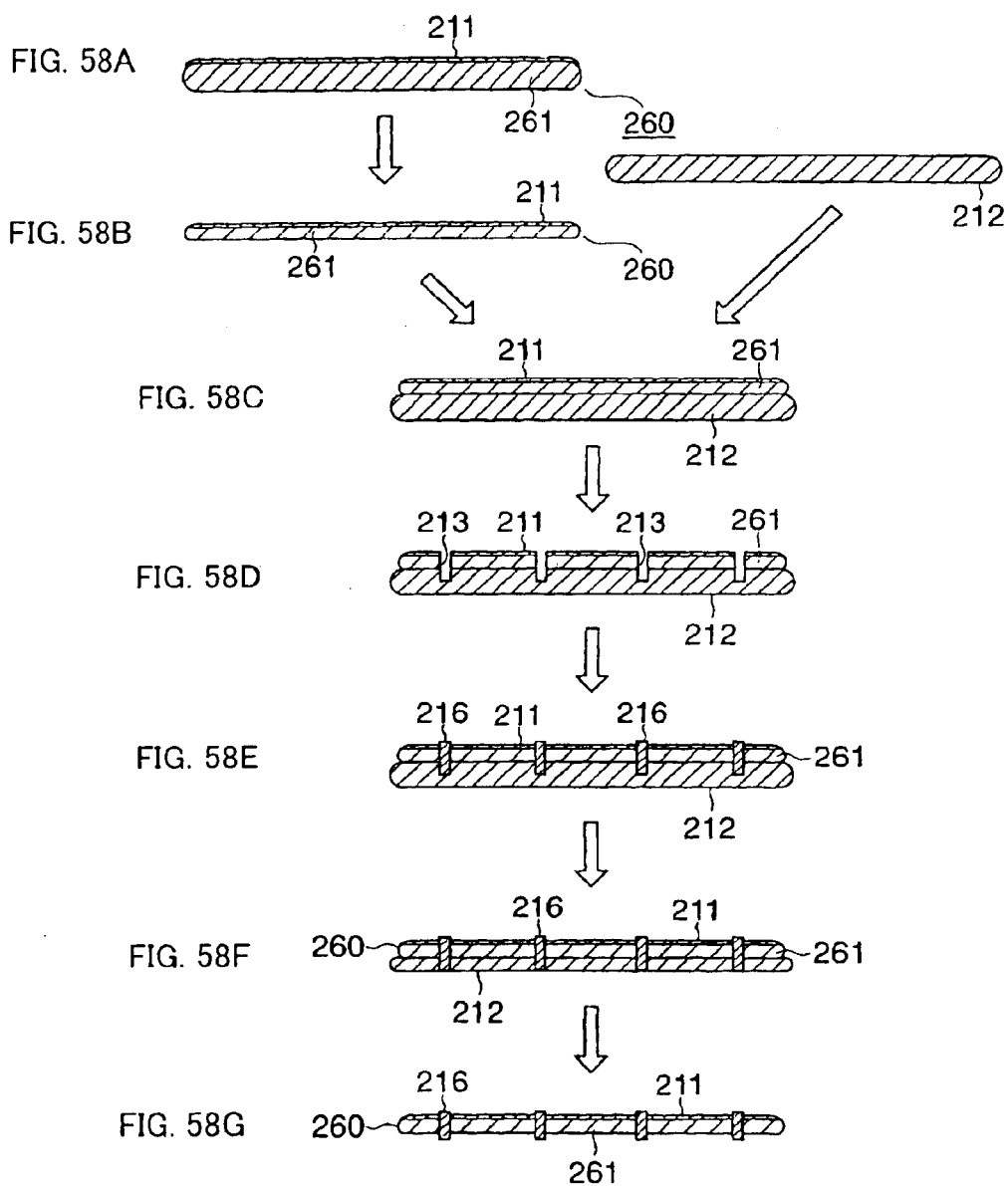
FIGS. 58A through FIG. 58G are views showing respective process steps of a semiconductor device manufacturing method according to a sixteenth embodiment of the present invention.
Figure 59:
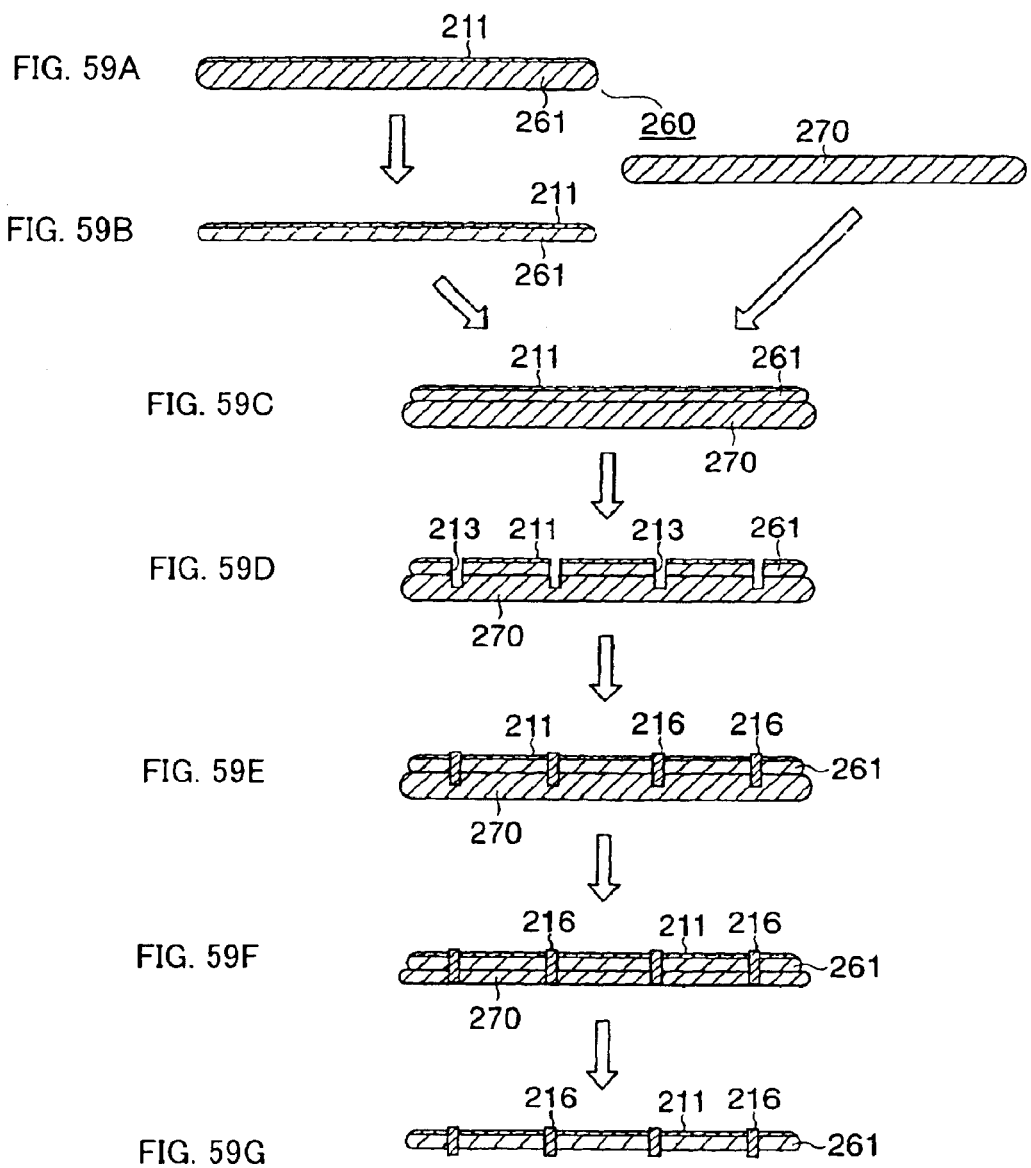
FIGS. 59A through FIG. 59G are views showing respective process steps of a semiconductor device manufacturing method according to a seventeenth embodiment of the present invention.

FIG. 56 is a cross sectional view of a semiconductor device when the substrate proper 210 is formed of an Si wafer with a penetration electrode 216 formed therethrough. FIG. 57 is a cross sectional view of another semiconductor device when the substrate proper 240 is formed of an SOI wafer with a penetration electrode 216 formed therethrough.

However, note that these figures are the comparison charts clearly showing a difference between using the substrate proper 210 and using the substrate proper 240, and the semiconductor devices illustrated in these figures are different in their construction from the semiconductor devices according to twelfth embodiment and the fifteenth embodiment.

In case of what is shown in FIG. 56, since the substrate proper 210 is electroconductive, an insulating film 250 is once formed on the inner wall surface of each hole 213. Thereafter, a metal film 251, which will later become a cathode for electroplating, is deposited on the insulating film 250, and a metal is then buried or filled into the holes 213 to form penetration electrodes 216.

On the other hand, in case of what is shown in FIG. 57, the substrate proper 240 is made of an SOI wafer, and a semiconductor film 251 including circuit element parts 211 of this substrate proper 240 is extremely thin. Beneath the semiconductor film 251, there is arranged a buried oxide film 241 that is an insulating film, as a lower layer of which is arranged a support board base member 212, which is to be finally removed. Therefore, an insulating film on the inner wall surface of each hole 213 becomes unnecessary.

Embodiment 16.

FIG. 58A through FIG. 58G show the respective process steps of a method for manufacturing semiconductor devices according to a sixteenth embodiment of the present invention.

In comparison with the method for manufacturing semiconductor devices according to the above-mentioned fifteenth embodiment, this embodiment differs therefrom in the following. That is, a substrate proper 260 of this embodiment is formed of a laminated type SOI, instead of a SOI wafer, which comprises an insulation base member 261 of quartz or silica glass for example and an ultrathin semiconductor layer adhered to the insulation base member 261.

In the semiconductor devices of this embodiment, the rear surface of the substrate proper 260 is processed by mechanical grinding, chemical mechanical polishing, etching or combinations thereof until the substrate proper 260 comes to a prescribed thickness, and thereafter penetration electrodes 216 are protruded from the rear surface of the substrate proper 260 according to a procedure similar to that of the fifteenth embodiment.

In this case, the insulation base member 261 can be thickened to about the limit of the etching depth. Therefore, in the semiconductor devices of this embodiment, handling of semiproducts or intermediate products in the respective manufacturing processes becomes easier than in the semiconductor devices of the fifteenth embodiment.

Embodiment 17.

FIG. 59A through FIG. 59G show the respective process steps of a method for manufacturing semiconductor devices according to a seventeenth embodiment of the present invention.

As compared with the method for manufacturing semiconductor devices according to the sixteenth embodiment, this embodiment differs therefrom in that an Al wafer is used as a support board base member 270 instead of an Si wafer.

In this embodiment, a metal plate is used as the support board base member 270, and after formation of holes 213, penetration electrodes 216 are formed in the holes 213 by means of electroplating. The formation of an insulating film on the inner wall surface of each hole 213 and the formation of a metal film used as a cathode for electroplating are unnecessary, and the interior of each hole 213 is buried or filled with a metal by electroplating with the support board base member 270 being made as a cathode.

Figure 60:
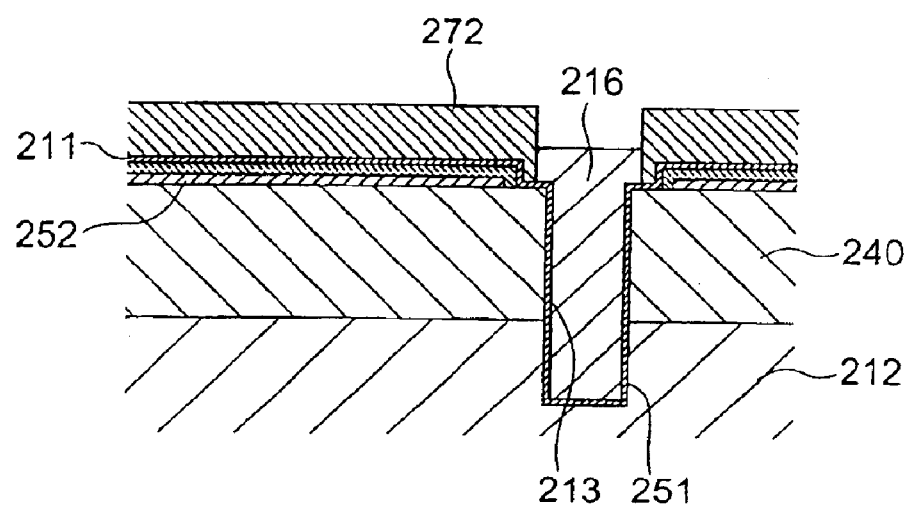
FIG. 60 is a cross sectional view of a semiconductor device when a support board base member is made of an Si wafer with a penetration electrode formed therethrough.

FIG. 60 is a cross sectional view of a semiconductor device when a support board base member 212 is made of an Si wafer with a penetration electrode 216 formed therethrough.

Figure 61:
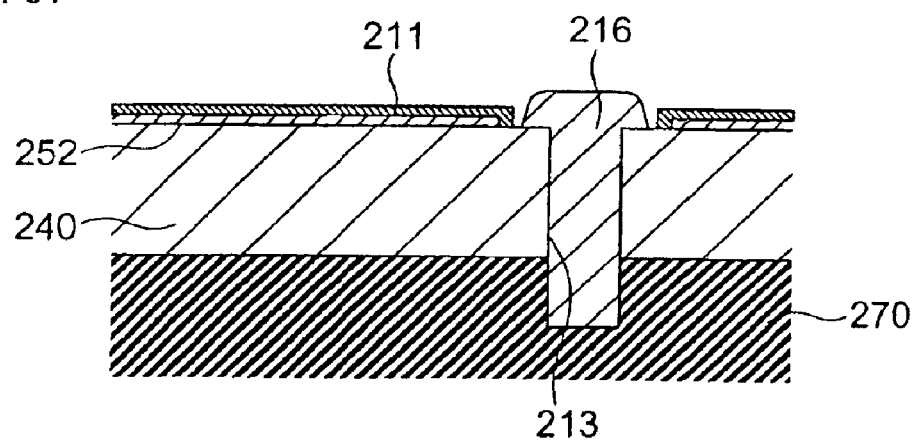
FIG. 61 is a cross sectional view of a semiconductor device when a support board base member is made of a metal with a penetration electrode formed therethrough.

FIG. 61 is a cross sectional view of a semiconductor device when a support board base member 270 is made of a metal with a penetration electrode 216 formed therethrough.

However, note that these figures are the comparison charts clearly showing a difference between using the support board base member 212 and using the support board base member 270, and the semiconductor devices illustrated in these figures are different in their construction from the semiconductor devices according to sixteenth embodiment and the seventeenth embodiment.

In case of what is shown in FIG. 60, a metal film 251, which will become a cathode for electroplating, is once formed on the entire surfaces of circuit element parts 211 and a substrate proper 240 including the inner wall surface of each hole 213, and a photoresist 272 has to be formed in such a manner that plating does not grow at locations other than the holes 213. In contrast to this, in case of what is shown in FIG. 61, the process steps of forming the metal film 251 and the photoresist 272 are unnecessary.

Here, note that a support board may be constructed such that an intermediate film made of a metal such as, for example, copper is deposited on a surface of an Si wafer, and holes reaching the intermediate film but not the Si wafer may be formed so that penetration electrodes are formed therein by means of electroplating with the intermediate layer being made as a cathode.

Embodiment 18.

FIG. 62A through FIG. 62E show the respective process steps of a method for manufacturing semiconductor devices according to an eighteenth embodiment of the present invention.

Hereinafter, a manufacturing procedure for semiconductor devices according to this embodiment will be explained based on these figures.

Figure 62A:
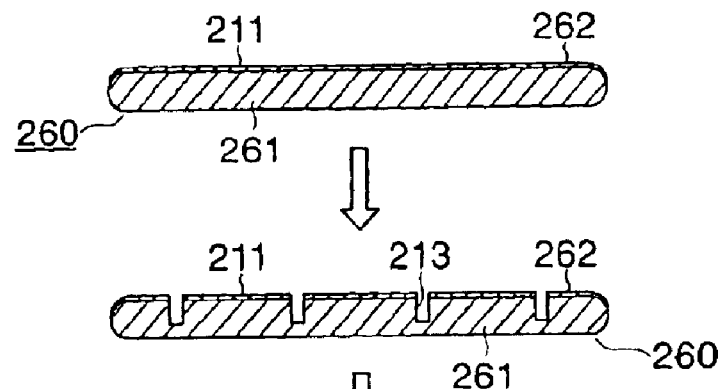
FIGS. 62A through FIG. 62E are views showing respective process steps of a semiconductor device manufacturing method according to an eighth embodiment of the present invention.

First of all, a circuit element part 211 having a prescribed function is formed on a circuit forming plane of a substrate proper 260 which is formed by adhering an insulation base member 261 to an SOI wafer 262 having an embedded oxide film (not shown), as shown in FIG. 62A (first step).

Figure 62B:
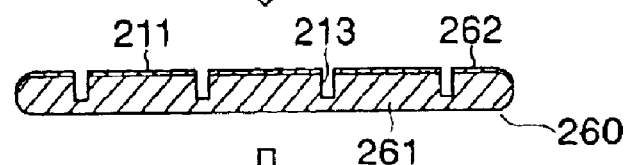

Then, holes 213 of about 100 $\mu$m in depth extending from the circuit element part 211 to the insulation base member 261 are formed by means of etching, as shown in FIG. 62B (second step).

Figure 62C:
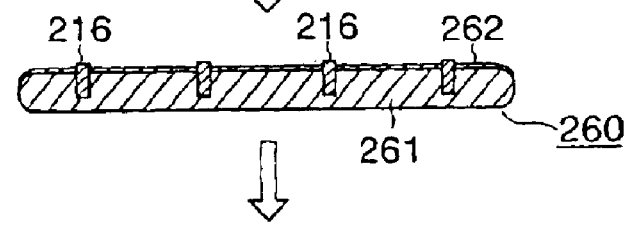

Thereafter, penetration electrodes 216 are formed in the holes 213 by electroplating without forming an insulating film on the inner side wall of each hole 213, as shown in FIG. 62C (third step).

Figure 62D:
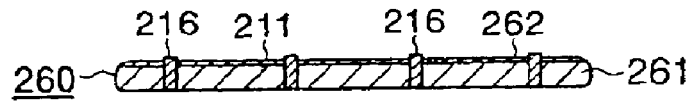

Subsequently, the rear surface of the substrate proper 260 is ground until a rear end face of each penetration electrode 216 is exposed, as shown in FIG. 62D (fourth step).

Figure 62E:
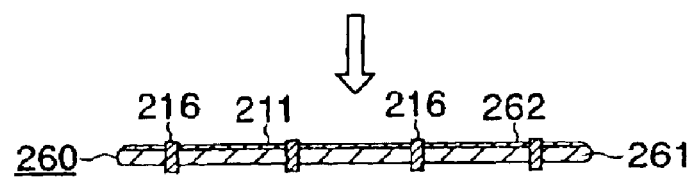
Figure 63A:
FIGS. 63A through FIG. 63G are views showing respective process steps of a known semiconductor device manufacturing method.
Figure 63B:
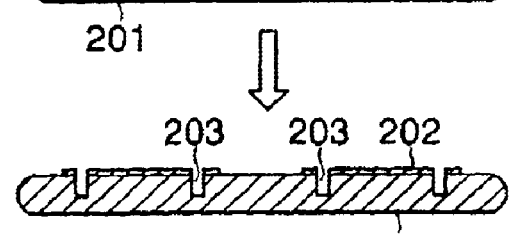
Figure 63C:
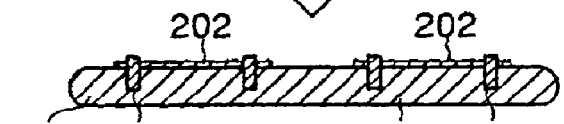
Figure 63D:
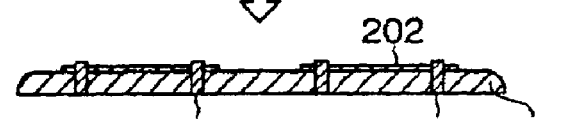
Figure 63E:
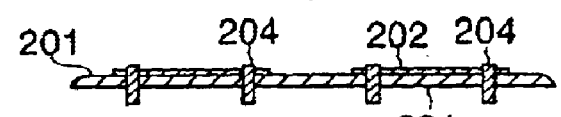
Figure 63F:
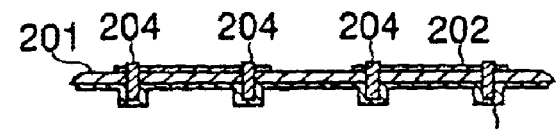
Figure 63G:
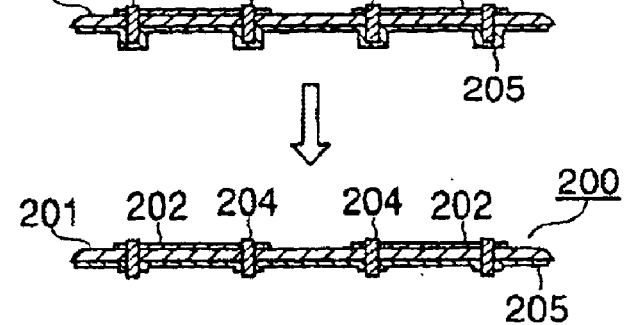

Finally, the insulation base member 261 is partially removed to a prescribed width by etching to provide a semiconductor device assembly in which the penetration electrodes 216 protrude from the rear surface of the substrate proper 260, as shown in FIG. 62E. The semiconductor device assembly is divided into a plurality of individual pieces to produce semiconductor devices (fifth step).

These semiconductor devices are an example of producing semiconductor devices having penetration electrodes without using any support board base member.

Although in the above-mentioned sixteenth through eighteenth embodiments, reference has been made to the cases where a substrate proper 260 comprising an SOI wafer 262 and an insulation base member 261 adhered to the SOI wafer 262 is used to produce semiconductor devices, a TFT substrate may instead be employed with the same effects or results.

As described in the foregoing, the present invention provides the following excellent advantages.

According to a first aspect of the present invention, a method for manufacturing semiconductor devices includes the steps of: adhering a support board to a rear surface of a substrate proper which has a plurality of circuit element parts with prescribed functions formed on a circuit forming plane on an obverse surface thereof; forming first groove portions, which reach the support board, on at least one of peripheral portions of the circuit element parts of the substrate proper and prescribed portions in the circuit element parts; forming holes in the first groove portions by using an insulating material in such a manner that the support board is exposed from a bottom of each of the holes; forming metal wiring patterns which extend from electrode portions formed in the circuit element parts to at least parts of inner walls of the holes; removing a prescribed amount of the support board at the bottom of each of the holes: filling a conductive material into the holes to form penetration electrodes in such a manner that the conductive material protrudes from the circuit forming plane; forming second groove portions, which reach the support board, in the peripheral portions of the circuit element parts; and removing the support board thereby to separate the substrate proper and the circuit element parts into a plurality of semiconductor devices. Thus, the base member is not made too thin in the course of manufacture, and hence handling of the semiproducts or intermediate products becomes easy, thereby making it possible to produce semiconductor devices having the penetration electrodes in a simple manner.

In a preferred form of the first aspect of the present invention, the first groove portions are formed in the peripheral portions of the circuit element parts, and the second groove portions are formed in the first groove portions. Thus, the groove portions can be produced by mechanical processing or machining.

In another preferred form of the first aspect of the present invention, a prescribed amount of substrate proper at the rear surface thereof is removed before the support board is adhered to the substrate proper, so that the holes in the semiconductor substrates can be formed easily.

In a further preferred form of the first aspect of the present invention, the first groove portions are formed by using a dicing saw. Thus, it is possible to form the first groove portions in an easy and efficient manner.

In a yet further preferred form of the first aspect of the present invention, the first groove portions are formed by means of reactive ion etching. Thus, it is possible to provide the first groove portions with higher dimensional precision.

In a still further preferred form of the first aspect of the present invention, an insulating film is formed on surfaces of semiconductor substrates, which are divided from said substrate proper, by using an insulating material at the same time when the holes reaching the support board in the first groove portions are formed. Thus, it is not necessary to specially provide a process of forming protective coats on the circuit element parts.

In a further preferred form of the first aspect of the present invention, the insulating material comprises a photosensitive polyimide or a photosensitive glass, and the holes are formed by means of a photolithography process. Thus, the entire process steps can be simplified as compared with the case in which the insulating material does not have photosensitivity.

In a further preferred form of the first aspect of the present invention, the second groove portions are formed by using a dicing saw, and hence it is possible to form the second groove portions in an easy and efficient manner.

In a further preferred form of the first aspect of the present invention, independently dispersed superfine particles, which are metal particles of about 3 to 30 nm in diameter covered with a surface active agent and dispersed in a solution, are applied by spin coating to the surfaces of the semiconductor substrates and the interior of each hole formed in the first groove portions, and then baked, after which the baked portions are partially removed to form metal portions buried or filled in the holes. Accordingly, environmental impact due to waste water treatments or the like is limited. In addition, the spin coating is compatible with the manufacturing processes for the semiconductor devices.

In a further preferred form of the first aspect of the present invention, the filling into the holes of the conductive material is performed by a gas deposition method in which superfine metal particles generated in a gas atmosphere by a deposition process are sprayed from nozzles directed toward the holes above the semiconductor substrates mounted on a stage in a decompression chamber. Accordingly, the time required of the filling process is short, and the filling material can be used without wastefulness, thus reducing its environmental impact.

In a further preferred form of the first aspect of the present invention, the support board comprises a metal plate, and the removal of a prescribed amount of the support board at the bottom of each hole is performed by means of an etching process using a corrosion liquid. Thus, it is possible to form the projection electrodes on the rear surfaces of the semiconductor substrates with ease.

In a further preferred form of the first aspect of the present invention, the filling of the metal into the holes is carried out by using electroplating with the support board being made as a cathode. Thus, the selective growth rate of the metal by electroplating is higher than in the case of using electroless plating, thereby making it possible to fill the holes alone as well as widening choices of the materials that can be used as such a metal.

According to a second aspect of the present invention, a method for manufacturing semiconductor devices includes the steps of: adhering a first support board to a rear surface of a substrate proper which has a plurality of circuit element parts with prescribed functions formed on a circuit forming plane on an obverse surface thereof; forming first groove portions, which reach the first support board, in the substrate proper; forming holes in the first groove portions by using an insulating material in such a manner that the first support board is exposed from a bottom of each of the holes; forming metal wiring patterns which extend from electrode portions formed in the circuit element parts to at least parts of inner walls of the holes; removing a prescribed amount of the first support board at the bottom of each of the holes: filling a conductive material into the holes to form penetration electrodes in such a manner that the conductive material protrudes from the circuit forming plane; forming second groove portions, which reach the first support board, in the peripheral portions of the circuit element parts; adhering a second support board to that side of semiconductor substrates divided from said substrate proper on which the circuit forming plane is formed; removing the first support board; inspecting circuit functions of the circuit element parts by placing test probes into contact with the penetration electrodes; and removing the second support board thereby to separate the substrate proper and the circuit element parts into a plurality of semiconductor devices. Accordingly, after the removal of the first support board, the plurality of semiconductor devices are not separated from one another but held together by means of the second support board. As a result, handling of the semi-manufactured semiconductor devices becomes accordingly easy, and the testing of the functionality of the circuit element parts can be facilitated.

In a preferred form of the second aspect of the present invention, the first groove portions are formed in the peripheral portions of the circuit element parts, and the second groove portions are formed in the first groove portions. Therefore, a conventional blade or cutter can be used to cut the substrate proper.

In another preferred form of the second aspect of the present invention, after a prescribed amount of insulating layer at the bottom of each hole has been removed, the metal wiring patterns extending from the electrode portions to the bottom of each hole are formed. Thus, the reliability of the electrical connections is improved.

In a further preferred form of the second aspect of the present invention, the holes arranged in two rows are formed in and along each first groove portion between adjacent ones of the circuit element parts, and a second groove portion is formed between these two rows of holes. Thus, the penetration electrodes in the peripheral portions each semiconductor device are formed in common first groove portions, so the manufacturing processes are simple, facilitating the production.

In a yet further preferred form of the second aspect of the present invention, the first groove portions extending in two rows are formed respectively between adjacent ones of the circuit element parts, and one row of holes are formed in each of the first groove portions, with one row of second grooves being formed between two rows of first groove portions. Thus, the second grooves are formed in the substrate proper, and hence a conventional blade or cutter can be used to cut the substrate proper. In addition, the peripheral portions of each of the semiconductor devices are parts of an associated one of the semiconductor substrates, and hence the semiconductor devices are high in rigidity, thereby making it possible to effectively protect the penetration electrodes in the peripheral portions.

In a still further preferred form of the second aspect of the present invention, the support board is adhered to the rear surface of the substrate proper by means of anode bonding. Thus, there is interposed no dissimilar material such as an adhesive or binding material or the like between the support board and the substrate proper, thus reducing in-process constraints such as chemical resistance, etc.

In a further preferred form of the second aspect of the present invention, the rear surface of the substrate proper and the support board are adhered to each other by a binding material, which is thereafter hardened to form an insulating layer, which remains on the rear surfaces of semiconductor substrates divided from the substrate proper after removal of the support board. Therefore, the binding material forms a stable insulating layer of each semiconductor device as it is.

In a further preferred form of the second aspect of the present invention, an oxide film is formed on the rear surface of the substrate proper before the support board is adhered to the rear surface of the substrate proper. Thus, the rear surface of each semiconductor substrate divided from the substrate proper is stabilized electrically and chemically thereby to improve the electrical performance and reliability of the semiconductor devices manufactured.

In a further preferred form of the second aspect of the present invention, the first groove portions are arranged in the corresponding circuit element parts, so that the penetration electrodes can be arranged at locations other than the peripheral portions of each semiconductor device.

According to a third aspect of the present invention, a method for manufacturing semiconductor devices includes the steps of: forming holes in a support board; filling an electrode material into the holes thereby to form first projection electrodes; forming first metal wiring patterns connected with first projection electrodes at prescribed positions of the support board; adhering a rear surface of a substrate proper, which has a plurality of circuit element parts with prescribed functions formed on a circuit forming plane on an obverse surface thereof, to the support board by using a binding material; forming first groove portions, which reach an insulating layer formed of the binding material before the first metal wiring patterns, in areas of the substrate proper between adjacent ones of the circuit element parts thereby to divide the substrate proper into a plurality of semiconductor substrates; forming an insulating film on surfaces of the semiconductor substrates except for electrode portions of the circuit element parts by the use of an insulating material, and forming holes, which reach the support board, in the first groove portions; forming second metal wiring patterns which extend from the electrode portions to at least parts of inner walls of the holes; removing the insulating layer at a bottom of each of the holes to expose the first metal wiring patterns; filling a metal into the holes to form penetration electrodes; forming second projection electrodes at prescribed locations of the second metal wiring patterns; forming second groove portions, which reach the support board, along the first groove portions; and removing the support board. Accordingly, it is possible to easily manufacture semiconductor devices each having the first projection electrodes and the second projection electrodes at the opposite sides thereof.

In a preferred form of the third aspect of the present invention, process steps of forming the holes in the support board and filling an electrode material into these holes or a process step of forming second projection electrodes at prescribed locations of the second metal wiring patterns can be eliminated. Thus, the entire processes are accordingly simplified.

In another preferred form of the third aspect of the present invention, after the insulating layer at the bottom of each hole is removed to expose the first metal wiring patterns, the second metal wiring patterns are formed which extend from the electrode portions so as to be connected with the first metal wiring patterns through the holes. Thus, a process step of filling a metal into the holes to form penetration electrodes can be eliminated.

In a further preferred form of the third aspect of the present invention, a step of forming projection electrodes on the circuit forming plane is included. Thus, semiconductor devices having the projection electrodes on the circuit forming plane can be easily obtained.

In a yet further preferred form of the third aspect of the present invention, a process of forming projection electrodes on the rear surfaces of the semiconductor substrates is included. Thus, semiconductor devices having the projection electrodes on the rear surfaces can be easily obtained.

According to a fourth aspect of the present invention, there is provided a method for manufacturing semiconductor devices with penetration electrodes penetrating through a substrate proper. The method includes the steps of: grinding a rear surface of the substrate proper, which has circuit element parts with prescribed functions formed on a circuit forming plane on an obverse surface thereof, up to a prescribed thickness; connecting the ground rear surface of the substrate proper to an insulating film of a support board, the insulating film being formed on an intermediate layer that is in turn formed on a surface of a support board base member; forming holes which extend from the circuit forming plane to the support board base member, and forming a penetrating insulating film on an inner side wall of each of the holes; filling a conductive material into the holes thereby to form the penetration electrodes; grinding the support board base member until the intermediate layer is exposed, whereby one end of each of the penetration electrodes is protruded; and removing the intermediate layer by etching to expose the insulating film. Thus, the substrate proper is supported by the support board base member in the course of manufacture. Accordingly, the formation of an insulating film after removal of the support board and the formation of openings or holes for the penetration electrodes, which are conventionally required, become no longer unnecessary. Therefore, it is possible to form the penetration electrodes that protrude from the rear surface of the substrate proper, by using simple process steps alone which do not require high machining or processing accuracy. As a result, the damage of the substrate proper in the manufacturing processes can be reduced, thus making it possible to improve the product yield of the semiconductor devices. Further, the provision of the insulating film on the rear side of the substrate proper serves to prevent the characteristics of the semiconductor devices from being deteriorated, which would otherwise be caused due to electrode materials remaining on the rear surface of the substrate proper and diffusing into the substrate proper to form an unexpected energy level at the time of removing the support board at the rear side of the substrate proper. In addition, the intermediate layer of the support board base member serves as a mark when the support board is removed, so that the removal of the support board can be stopped at a location prior to the insulating film in a reliable manner. As a consequence, the insulating film is formed reliably or without fail on the rear side of each semiconductor device.

According to a fifth aspect of the present invention, there is provided a method for manufacturing semiconductor devices with penetration electrodes penetrating through a substrate proper. The method includes the steps of: removing a rear surface of a substrate proper, which has circuit element parts with prescribed functions formed on a circuit forming plane on an obverse surface thereof, up to a prescribed thickness; connecting the removed rear surface of the substrate proper to an intermediate layer of a support board by means of a binding material, the intermediate layer being formed on a surface of a support board base member; hardening the binding material to form an insulating film; forming holes which extend from the circuit forming plane to the support board base member, and forming a penetrating insulating film on an inner side wall of each of the holes; filling a conductive material into the holes thereby to form the penetration electrodes; grinding the support board base member until the intermediate layer is exposed, so that one end of each of the penetration electrodes is protruded; removing the intermediate layer by etching to expose the insulating film. Thus, the substrate proper is supported by the support board base member in the course of manufacture. Therefore, the formation of an insulating film after removal of the support board and the formation of openings or holes for the penetration electrodes, which are conventionally required, become no longer unnecessary, whereby it is possible to form the penetration electrodes that protrude from the rear surface of the substrate proper, by the use of simple process steps alone which do not require high machining or processing accuracy. Consequently, damage to the substrate proper in the manufacturing processes is reduced so that the product yield of the semiconductor devices can be improved. In addition, the provision of the insulating film on the rear side of the substrate proper serves to prevent the characteristics of the semiconductor devices from being deteriorated, which would otherwise be caused due to electrode materials remaining on the rear surface of the substrate proper and diffusing into the substrate proper to form an unexpected energy level at the time of removal of the support board at the rear side of the substrate proper. Moreover, the intermediate layer of the support board base member serves as a mark when the support board is removed, so that the removal of the support board can be stopped at a location prior to the insulating film in a reliable manner. As a consequence, the insulating film is formed reliably or without fail on the rear side of each semiconductor device. In addition, the insulating film also acts as an adhesive that connects the support board and the substrate proper with each other, and hence the connection step also serves as an insulating film forming step as it is. Thus, the entire manufacturing processes are simplified.

According to a sixth aspect of the present invention, there is provided a method for manufacturing semiconductor devices with penetration electrodes penetrating through a substrate proper. The method includes the steps of: removing a rear surface of the substrate proper, which has circuit element parts with prescribed functions formed on a circuit forming plane on an obverse surface thereof, up to a prescribed thickness; connecting the removed rear surface of the substrate proper to an insulating film of a support board, the insulating film being formed on a surface of a support board base member; forming holes which extend from the circuit forming plane to the support board base member, and forming a penetrating insulating film on an inner side wall of each of the holes; filling a conductive material into the holes thereby to form the penetration electrodes; and removing the support board base member in such a manner that one end of each of the penetration electrodes is protruded, while leaving the insulating film. Thus, the substrate proper is supported by the support board base member in the course of manufacture. Therefore, the formation of an insulating film after removal of the support board and the formation of openings or holes for the penetration electrodes, which are conventionally required, become no longer unnecessary, whereby it is possible to form the penetration electrodes that protrude from the rear surface of the substrate proper, by the use of simple process steps alone which do not require high machining or processing accuracy. As a result, damage to the substrate proper in the manufacturing processes is reduced so that the product yield of the semiconductor devices can be improved.

In addition, the provision of the insulating film on the rear side of the substrate proper serves to prevent the characteristics of the semiconductor devices from being deteriorated, which would otherwise be caused due to electrode materials remaining on the rear surface of the substrate proper and diffusing into the substrate proper to form an unexpected energy level at the time of removal of the support board at the rear side of the substrate proper.

Further, the intermediate layer of the support board base member serves as a mark when the support board is removed, so that the removal of the support board can be stopped at a location prior to the insulating film in a reliable manner. As a consequence, the insulating film is formed reliably or without fail on the rear side of each semiconductor device.

Furthermore, since there exists no intermediate layer which serves as a mark for removal of the rear side of the support board, accordingly higher accuracy for removal processing is required but a step of forming an intermediate layer becomes unnecessary, so the manufacturing processes can be simplified as a whole.

According to a seventh aspect of the present invention, there is provided a method for manufacturing semiconductor devices with penetration electrodes penetrating through a substrate proper. The method includes the steps of: removing a rear surface of the substrate proper, which has circuit element parts with prescribed functions formed on a circuit forming plane on an obverse surface thereof, up to a prescribed thickness; connecting the removed rear surface of the substrate proper to a surface of a support board base member by means of a binding material; hardening the binding material to form an insulating film; forming holes which extend from the circuit forming plane to the support board base member, and forming a penetrating insulating film on an inner side wall of each of the holes; filling a conductive material into the holes thereby to form the penetration electrodes; and removing the support board base member in such a manner that one end of each of the penetration electrodes is protruded, while leaving the insulating film. Thus, the substrate proper is supported by the support board base member in the course of manufacture. Therefore, the formation of an insulating film after removal of the support board and the formation of openings or holes for the penetration electrodes, which are conventionally required, become no longer unnecessary, whereby it is possible to form the penetration electrodes that protrude from the rear surface of the substrate proper, by the use of simple process steps alone which do not require high machining or processing accuracy. As a result, damage to the substrate proper in the manufacturing processes is reduced so that the product yield of the semiconductor devices can be improved.

In addition, the provision of the insulating film on the rear side of the substrate proper serves to prevent the characteristics of the semiconductor devices from being deteriorated, which would otherwise be caused due to electrode materials remaining on the rear surface of the substrate proper and diffusing into the substrate proper to form an unexpected energy level at the time of removal of the support board at the rear side of the substrate proper.

Further, the insulating film also acts as an adhesive that connects the support board and the substrate proper with each other, and hence the connection step also serves as an insulating film forming step as it is, thus simplifying the manufacturing processes.

Furthermore, since there exists no intermediate layer which serves as a mark for removal of the rear side of the support board, accordingly higher accuracy for removal processing is required but a step of forming an intermediate layer becomes unnecessary, so the manufacturing processes can be simplified.

According to an eighth aspect of the present invention, there is provided a method for manufacturing semiconductor devices with penetration electrodes penetrating through a substrate proper. The method includes the steps of: removing a rear surface of the substrate proper, which has a buried oxide film that is an insulating film, to a prescribed thickness; connecting the removed rear surface of the substrate proper to a surface of a support board base member; forming holes which extend from an obverse surface of the substrate proper to the support board base member; filling a conductive material into the holes thereby to form the penetration electrodes; and removing the support board base member in such a manner that one end of each of the penetration electrodes is protruded, while leaving the insulating film. Thus, the substrate proper is supported by the support board base member in the course of manufacture. Thus, the formation of an insulating film after removal of the support board and the formation of openings or holes for the penetration electrodes, which are conventionally required, become no longer unnecessary, whereby it is possible to form the penetration electrodes that protrude from the rear surface of the substrate proper, by the use of simple process steps alone which do not require high machining or processing accuracy. As a result, damage to the substrate proper in the manufacturing processes is reduced so that the product yield of the semiconductor devices can be improved.

In addition, the provision of the insulating film on the rear side of the substrate proper serves to prevent the characteristics of the semiconductor devices from being deteriorated, which would otherwise be caused due to electrode materials remaining on the rear surface of the substrate proper and diffusing into the substrate proper to form an unexpected energy level at the time of removal of the support board at the rear side of the substrate proper.

Further, since the substrate proper itself has the insulating film, a step of forming an insulating film on the support board base member becomes unnecessary, so not only the manufacturing processes can be simplified, but also the insulation performance of the penetration electrodes can be improved.

According to a ninth aspect of the present invention, there is provided a method for manufacturing semiconductor devices with penetration electrodes penetrating through a substrate proper. The method includes the steps of: removing a rear surface of the substrate proper, which has a buried oxide film that is an insulating film, to a prescribed thickness; forming holes which extend from an obverse surface of the substrate proper past the buried oxide film; filling a conductive material into the holes thereby to form the penetration electrodes; and removing the rear surface of the substrate proper in such a manner that one end of each of the penetration electrodes is protruded and the buried oxide film is exposed. Thus, the formation of an insulating film after removal of the support board and the formation of openings or holes for the penetration electrodes, which are conventionally required, become no longer unnecessary, whereby it is possible to form the penetration electrodes that protrude from the rear surface of the substrate proper, by the use of simple process steps alone which do not require high machining or processing accuracy. As a result, damage to the substrate proper in the manufacturing processes is reduced so that the product yield of the semiconductor devices can be improved.

In addition, the provision of the insulating film on the rear side of the substrate proper serves to prevent the characteristics of the semiconductor devices from being deteriorated, which would otherwise be caused due to electrode materials remaining on the rear surface of the substrate proper and diffusing into the substrate proper to form an unexpected energy level at the time of removal of the support board at the rear side of the substrate proper.

Further, since the support board is not used, a step of connecting the substrate proper and the support board with each other becomes unnecessary, and hence the manufacturing processes can be simplified.

Furthermore, since the substrate proper itself has the insulating film, a step of forming an insulating film on the support board base member becomes unnecessary, so not only the manufacturing processes can be simplified, but also the insulation performance of the penetration electrodes can be improved.

In a preferred form of the seventh or eighth aspect of the present invention, the substrate proper comprises an SOI wafer. Thus, semiconductor elements formed of the SOI wafer can operate at high speed as compared with semiconductor elements formed of an ordinary wafer, so that there can be provided semiconductor devices capable of higher speed operation.

In a preferred form of the seventh or eighth aspect of the present invention, the substrate proper comprises a laminated type SOI wafer in which an ultrathin semiconductor layer is adhered to an insulating substrate. Therefore, the rigidity of the substrate proper is accordingly increased, and handling of the semi-processed products in each manufacturing process step becomes easy.

In another preferred form of the seventh or eighth aspect of the present invention, the substrate proper comprises a TFT substrate. Thus, semiconductor devices having ultrathin semiconductor elements on insulating substrates can be provided more easily and at lower cost than with a substrate proper comprising a laminated type SOI.

In a further preferred form of the seventh or eighth aspect of the present invention, the support board base member is made of a metal, and the penetration electrodes are formed by means of electroplating with the support board base member being made as a cathode. Thus, when the penetration electrodes are formed in the holes, respectively, there is no need to form, on the inner wall surface of each hole, a metal film which becomes a cathode for electroplating.

In a yet further preferred form of the seventh or eighth aspect of the present invention, the support board has an intermediate layer of a metal deposited on a surface of the support board base member, and the penetration electrodes are formed by means of electroplating with the intermediate layer being made as a cathode. Therefore, when the penetration electrodes are formed in the holes, respectively, there is no need to form, on the inner wall surface of each hole, a metal film which becomes a cathode for electroplating.

In a further preferred form of the fourth or seventh aspect of the present invention, the support board base member is removed by etching after one end face of each penetration electrode is flattened. Thus, the one end of each penetration electrode can be protruded from the substrate proper in a reliable manner, whereby there can be provided good electrical connectivity with other electrical components through the penetration electrodes.

In a further preferred form of the fourth or seventh aspect of the present invention, the grinding of the support board base member can be stopped before the penetration electrode is exposed, and thereafter the support board base member is removed by etching until the insulating film is reached. Consequently, one end of each penetration electrode is protruded from the substrate proper in a reliable manner.

In a further preferred form of the fourth or seventh aspect of the present invention, the support board base member is removed by etching so that one end of each penetration electrode is protruded from the substrate proper in a reliable manner.

In a further preferred form of the fourth, sixth, or eighth aspect of the present invention, the connection between the support board base member and the substrate proper is performed by anode bonding. Thus, there is interposed no dissimilar material between the support board base member and the substrate proper, thereby making it easy to form the holes by etching.

In a further preferred form of the fifth or seventh aspect of the present invention, the binding material comprises a polyimide resin. Thus, the process cost can be reduced as compared with anode bonding which is technically advanced or sophisticated and costly.

In a further preferred form of the fourth aspect of the present invention, the support board base member is formed of a silicon wafer, and the intermediate layer is made of aluminum, and the insulating film comprises a silicon oxide film. Thus, these materials are generally used in current semiconductor manufacturing processes, and hence their processing technologies have accordingly been highly developed and established. As a result, the yield of products can be improved and the manufacturing cost can be reduced.

In a further preferred form of the fifth or eighth aspect of the present invention, the support board base member is made of aluminum. Thus, aluminum, which is a material that is generally used in current semiconductor manufacturing processes and hence has been highly developed and established in its processing technology, is used so that the yield of products can be improved and the manufacturing cost can be reduced.

In a specific form of any one of the first through ninth aspects of the present invention, there is provided electronic equipment including a plurality of semiconductor devices manufactured according to either one of the abovementioned semiconductor device manufacturing methods, wherein the plurality of semiconductor devices are laminated in such a manner that vertically adjacent projection electrodes are mutually connected with each other. Thus, the electronic equipment with a high level of integration and high performance can be obtained.

In another specific form of any one of the first through ninth aspects of the present invention, there is provided electronic equipment including at least one semiconductor device manufactured according to either one of the above-mentioned semiconductor device manufacturing methods, wherein a circuit board having a passive element mounted thereon is connected with penetration electrodes formed on one surface of the at least one semiconductor device. Thus, the electronic equipment can be reduced in size as compared with conventional so-called hybrid ICs.

In a further specific form of any one of the first through ninth aspects of the present invention, there is provided electronic equipment including at least one semiconductor device manufactured according to either one of the above-mentioned semiconductor device manufacturing methods, wherein the semiconductor device is arranged in such a manner that opposite side surfaces thereof are sandwiched between a first circuit board and a second circuit board which are connected to at least one of a penetration electrode and a projection electrode. Thus, the electronic equipment can be of a three-dimensional connection structure and hence obtained with a high degree of freedom and a high level of integration.

In a still further specific form of any one of the first through ninth aspects of the present invention, there is provided electronic equipment including at least one semiconductor device manufactured according to either one of the above-mentioned semiconductor device manufacturing methods, wherein the semiconductor device is embedded in a core of a circuit board, and wirings formed on opposite side surfaces of the circuit board are connected with penetration electrodes. Thus, the electronic equipment can be of a three-dimensional connection structure and hence obtained at a reduced size with a high degree of freedom. and a high level of integration. In addition, wiring delays can be decreased.

According to a tenth aspect of the present invention, there is provided a semiconductor device including a semiconductor substrate with a circuit element part having a prescribed function formed on a principle plane thereof. The semiconductor substrate has through holes extending from a circuit forming plane to the opposite side of the circuit forming plane. A plurality of electrical conduction paths are formed along the through holes and are each surrounded on their peripheries by an insulating material. There is interposed nothing between adjacent ones of the conduction paths except for the insulating material. Therefore, the semiconductor device with high reliability can be obtained.

According to an eleventh aspect of the present invention, there is provided a semiconductor device comprising: a substrate proper having holes which extend substantially vertically from a circuit forming plane to penetrate the substrate proper; penetration electrodes extending through the corresponding holes, respectively, and each having one end thereof protruded from at least one of the opposite side surfaces of the substrate proper; a penetrating insulating film formed on the peripheral surface of each of the penetration electrodes; and an insulating film formed on a surface of the substrate proper at a side thereof at which the penetration electrodes are protruded from the substrate proper, in such a manner that it perpendicularly intersects the penetrating insulating film. Thus, the rear surface of the substrate proper is not exposed between the penetration electrodes and the substrate proper. Therefore, there is no insulation problem, and the insulating film does not run on the end faces of the penetration electrodes, so no problem arises in the electrical connectivity of the penetration electrodes.

In a preferred form of the eleventh aspect of the present invention, the end faces of the penetration electrodes penetrating through the substrate proper so as to be protruded therefrom are flat and substantially in parallel to the circuit forming plane of the substrate proper. Thus, electrical connectivity between semiconductor devices thus manufactured, when stacked or laminated one over another and electrically connected with one another, is good.

While the invention has been described in terms of preferred embodiments, those skilled in the art will recognize that the invention can be practiced with modifications within the spirit and scope of the appended claims.

What is claimed is:

1. A method for manufacturing semiconductor devices, comprising the steps of:
   adhering a support board to a rear surface of a substrate proper which has a plurality of circuit element parts with prescribed functions formed on a circuit forming plane on an obverse surface thereof;
   forming first groove portions, which reach the support board, on at least one of peripheral portions of said circuit element parts of said substrate proper and prescribed portions in said circuit element parts;
   forming holes in said first groove portions by using an insulating material in such a manner that said support board is exposed from a bottom of each of said holes;
   forming metal wiring patterns which extend from electrode portions formed in said circuit element parts to at least parts of inner walls of said holes;
   removing a prescribed amount of the support board at the bottom of each of said holes:
   filling a conductive material into said holes to form penetration electrodes in such a manner that the conductive material protrudes from said circuit forming plane;
   forming second groove portions, which reach the support board, in the peripheral portions of said circuit element parts; and
   removing said support board thereby to separate said substrate proper and said circuit element parts into a plurality of semiconductor devices.

2. The method for manufacturing semiconductor devices according to claim 1, wherein said first groove portions are formed in the peripheral portions of said circuit element parts, and said second groove portions are formed in said first groove portions.

3. The method for manufacturing semiconductor devices according to claim 1, wherein an insulating film is formed on surfaces of semiconductor substrates, which are divided from said substrate proper, by using an insulating material at the same time when said holes reaching said support board in said first groove portions are formed.

4. The method for manufacturing semiconductor devices according to claim 1, wherein filling a metal into said holes is carried out by using electroplating with said support board being made as a cathode.

5. The method for manufacturing semiconductor devices according to claim 1, wherein said support board is adhered to the rear surface of said substrate proper by means of anode bonding.

6. The method for manufacturing semiconductor devices according to claim 1, wherein the rear surface of said substrate proper and said support board are adhered to each other by a binding material, which is thereafter hardened to form an insulating layer, which remains on the rear surfaces of semiconductor substrates divided from said substrate proper after removal of said support board.

7. The method for manufacturing semiconductor devices according to claim 1, wherein an oxide film is formed on the rear surface of said substrate proper before said support board is adhered to the rear surface of said substrate proper.

8. A method for manufacturing semiconductor devices, comprising the steps of:
  adhering a first support board to a rear surface of a substrate proper which has a plurality of circuit element parts with prescribed functions formed on a circuit forming plane on an obverse surface thereof;
  forming first groove portions, which reach said first support board, in said substrate proper;
  forming holes in said first groove portions by using an insulating material in such a manner that said first support board is exposed from a bottom of each of said holes;
  forming metal wiring patterns which extend from electrode portions formed in said circuit element parts to at least parts of inner walls of said holes;
  removing a prescribed amount of said first support board at the bottom of each of said holes:
  filling a conductive material into said holes to form penetration electrodes in such a manner that said conductive material protrudes from said circuit forming plane;
  forming second groove portions, which reach said first support board, in the peripheral portions of said circuit element parts;
  adhering a second support board to that side of semiconductor substrates divided from said substrate proper on which said circuit forming plane is formed;
  removing said first support board;
  inspecting circuit functions of said circuit element parts by placing test probes into contact with said penetration electrodes; and
  removing said second support board thereby to separate said substrate proper and said circuit element parts into a plurality of semiconductor devices.

9. A method for manufacturing semiconductor devices, comprising the steps of:
  forming holes in a support board;
  filling an electrode material into said holes thereby to form first projection electrodes;
  forming first metal wiring patterns connected with first projection electrodes at prescribed positions of said support board;
  adhering a rear surface of a substrate proper, which has a plurality of circuit element parts with prescribed functions formed on a circuit forming plane on an obverse surface thereof, to said support board by using a binding material;
  forming first groove portions, which reach an insulating layer formed of said binding material before said first metal wiring patterns, in areas of said substrate proper between adjacent ones of said circuit element parts;
  forming an insulating film on surfaces of said semiconductor substrates except for electrode portions of said circuit element parts by the use of an insulating material, and forming holes, which reach said support board, in said first groove portions;
  forming second metal wiring patterns which extend from said electrode portions to at least parts of inner walls of said holes;
  removing said insulating layer at a bottom of each of said holes to expose said first metal wiring patterns;
  filling a metal into said holes to form penetration electrodes;
  forming second projection electrodes at prescribed locations of said second metal wiring patterns;
  forming second groove portions, which reach said support board, along said first groove portions thereby to divide said substrate proper into a plurality of semiconductor substrates; and
  removing said support board.

10. A method for manufacturing semiconductor devices with penetration electrodes penetrating through a substrate proper, said method comprising the steps of:
  grinding a rear surface of said substrate proper, which has circuit element parts with prescribed functions formed on a circuit forming plane on an obverse surface thereof, up to a prescribed thickness;
  connecting the ground rear surface of said substrate proper to an insulating film of a support board, said insulating film being formed on an intermediate layer that is in turn formed on a surface of a support board base member;
  forming holes which extend from said circuit forming plane to said support board base member, and forming a penetrating insulating film on an inner side wall of each of said holes;
  filling a conductive material into said holes thereby to form said penetration electrodes,
  grinding said support board base member until said intermediate layer is exposed, whereby one end of each of said penetration electrodes is protruded; and
  removing said intermediate layer by etching to expose said insulating film.

11. The method for manufacturing semiconductor devices according to claim 10, wherein connecting the ground rear surface of said substrate proper to said insulating film of said support board is carried out by anode bonding.

12. A method for manufacturing semiconductor devices with penetration electrodes penetrating through a substrate proper, said method comprising the steps of:
  removing a rear surface of said substrate proper, which has circuit element parts with prescribed functions formed on a circuit forming plane on an obverse surface thereof, up to a prescribed thickness;
  connecting the removed rear surface of said substrate proper to an insulating film of a support board, said insulating film being beforehand formed on a surface of a support board base member;
  forming holes which extend from said circuit forming plane to said support board base member, and forming a penetrating insulating film on an inner side wall of each of said holes;
  filling a conductive material into said holes thereby to form said penetration electrodes; and
  removing said support board base member in such a manner that one end of each of said penetration electrodes is protruded, while leaving said insulating film.

13. A method for manufacturing semiconductor devices with penetration electrodes penetrating through a substrate proper, said method comprising the steps of:

removing a rear surface of said substrate proper, which has circuit element parts with prescribed functions formed on a circuit forming plane on an obverse surface thereof, up to a prescribed thickness;

connecting the removed rear surface of said substrate proper to a surface of a support board base member by means of a binding material;

hardening said binding material to form an insulating film;

forming holes which extend from said circuit forming plane to said support board base member, and forming a penetrating insulating film on an inner side wall of each of said holes;

filling a conductive material into said holes thereby to form said penetration electrodes; and removing said support board base member in such a manner that one end of each of said penetration electrodes is protruded, while leaving said insulating film.

14. The method for manufacturing semiconductor devices according to claim 13, wherein said binding material comprises a polyimide resin.

15. A method for manufacturing semiconductor devices with penetration electrodes penetrating through a substrate proper, said method comprising the steps of:

removing a rear surface of said substrate proper, which has a buried oxide film that is an insulating film, to a prescribed thickness;

connecting the removed rear surface of said substrate proper to a surface of a support board base member;

forming holes which extend from an obverse surface of said substrate proper to said support board base member;

filling a conductive material into said holes thereby to form said penetration electrodes; and removing said support board base member in such a manner that one end of each of said penetration electrodes is protruded, while leaving said insulating film.

16. The method for manufacturing semiconductor devices according to claim 15, wherein said substrate proper comprises an SOI wafer.

17. A method for manufacturing semiconductor devices with penetration electrodes penetrating through a substrate proper, said method comprising the steps of:

removing a rear surface of said substrate proper, which has a buried oxide film that is an insulating film, to a prescribed thickness;

forming holes which extend from an obverse surface of said substrate proper past said buried oxide film;

filling a conductive material into said holes thereby to form said penetration electrodes; and removing the rear surface of said substrate proper in such a manner that one end of each of said penetration electrodes is protruded and said buried oxide film is exposed.

* * * * *